United States Patent [19]

Jang et al.

[11] Patent Number: 5,481,487
[45] Date of Patent: Jan. 2, 1996

[54] TRANSPOSE MEMORY FOR DCT/IDCT CIRCUIT

[75] Inventors: Yi-Feng Jang, Keelung; Jinn-Nan Kao; Po-Chuan Huang, both of Hsinchu, all of Taiwan

[73] Assignee: Industrial Technology Research Institute, Hsinchu, Taiwan

[21] Appl. No.: 189,446

[22] Filed: Jan. 28, 1994

[51] Int. Cl.$^6$ ............................................. G06F 15/332
[52] U.S. Cl. ....................................................... 364/725
[58] Field of Search .................................... 364/725, 726; 382/56

[56] References Cited

U.S. PATENT DOCUMENTS

| | | | |
|---|---|---|---|
| 4,150,434 | 4/1979 | Shibayama et al. | 364/704 |
| 4,493,048 | 1/1985 | Kung et al. | 364/754 |
| 4,553,220 | 11/1985 | Swanson | 364/715 |
| 4,601,006 | 7/1986 | Liu | 364/726 |
| 4,603,348 | 7/1986 | Yamada et al. | 382/56 |
| 4,719,588 | 1/1988 | Tatemichi et al. | 364/754 |
| 4,769,790 | 9/1988 | Yamashita . | |
| 4,787,057 | 11/1988 | Hammond et al. | 364/754 |
| 4,791,598 | 12/1988 | Liou et al. . | |
| 4,841,469 | 6/1989 | Kuenemund et al. | 364/754 |
| 4,903,231 | 2/1990 | Artieri . | |
| 4,918,527 | 4/1990 | Penard et al. . | |
| 4,937,776 | 6/1990 | Myers et al. | 364/736 |
| 5,031,038 | 7/1991 | Guillemot et al. | 364/725 |
| 5,038,312 | 8/1991 | Kojima et al. | 364/736 |
| 5,042,007 | 8/1991 | D'Luna . | |
| 5,053,985 | 10/1991 | Friedlander et al. . | |
| 5,177,704 | 1/1993 | D'Luna . | |
| 5,181,183 | 1/1993 | Miyazaki | 364/725 |
| 5,204,830 | 4/1993 | Wang et al. | 364/754 |
| 5,226,002 | 7/1993 | Wu et al. | 364/754 |
| 5,267,185 | 11/1993 | Akabane et al. | 364/736 |
| 5,291,429 | 3/1994 | Iwama et al. | 364/725 |

OTHER PUBLICATIONS

"A 100–MHz 2–D Discrete Cosine Transform Core Processor", by Shin–ichi Uramoto, Yoshitsugu Inoue, Akihiko Takabatake, Jun Takeda, Yukihiro Yamashita, Hideyuki Terane, and Masahiko Yoshimoto, Journal of Solid State Circuits, vol. 27, No. 4, Apr., 1992.

N. Cho & S. Lee, "Fast Algorithm and Implementation of 2–D Discrete Cosine Transform", IEEE Transactions on Circuits and Systems, vol. 38, No. 3, Mar., 1991, pp. 297–305.

M. Sun, T. Chen & A. Gottlieb, "VLSI Implementation of a 16×16 Discrete Cosine Transform", IEE Transactions on Circuits and Systems, vol. 36, No. 4, Apr., 1989, pp. 610–617.

H. Hou, "A Fast Recursive Algorithm for Computing the Discrete Cosine Transform", IEEE Transactions on Acoustics, Speech, and Signal Processing, vol. ASSP–35, No. 10, Oct., 1987, pp. 1455–1461.

N. Ahmed, T. Natarajan & K. Rao, "Discrete Cosine Transform", IEEE Trans. on Computers, vol. C–23, Jan., 1974, 90–93.

Primary Examiner—Tan V. Mai
Attorney, Agent, or Firm—Meltzer, Lippe et al.

[57] ABSTRACT

A transpose memory is disclosed which has four dual port memories, a first counter for writing elements in the dual port memories and a second counter for reading out elements from the dual port memories. If the received matrix is to be outputted to the first type of transform circuit, the first counter writes each matrix element in a particular dual port memory assigned to the quadrant of the matrix element. If the received matrix is to be outputted to the second type of transform circuit, the first counter writes each matrix element in a particular dual port memory assigned to the "evenness" or "oddness" (i.e., divisibleness by two) of the row and column of the matrix element.

15 Claims, 17 Drawing Sheets

| 171-0 | 171-1 | 171-2 | 171-3 |
|---|---|---|---|
| 1 | 2 | 3 | 4 |
| 171-4 | 171-5 | 171-6 | 171-7 |
| 9 | 10 | 11 | 12 |
| 171-8 | 171-9 | 171-10 | 171-11 |
| 17 | 18 | 19 | 20 |
| 171-12 | 171-13 | 171-14 | 171-15 |
| 25 | 26 | 27 | 28 |

142

| 172-0 | 172-1 | 172-2 | 172-3 |
|---|---|---|---|
| 8 | 7 | 6 | 5 |
| 172-4 | 172-5 | 172-6 | 172-7 |
| 16 | 15 | 14 | 13 |
| 172-8 | 172-9 | 172-10 | 172-11 |
| 24 | 23 | 22 | 21 |
| 172-12 | 172-13 | 172-14 | 172-15 |
| 32 | 31 | 30 | 29 |

143

| 173-0 | 173-1 | 173-2 | 173-3 |
|---|---|---|---|
| 57 | 58 | 59 | 60 |
| 173-4 | 173-5 | 173-6 | 173-7 |
| 49 | 50 | 51 | 52 |
| 173-8 | 173-9 | 173-10 | 173-11 |
| 41 | 42 | 43 | 44 |
| 173-12 | 173-13 | 173-14 | 173-15 |
| 33 | 34 | 35 | 36 |

144

| 174-0 | 174-1 | 174-2 | 174-3 |
|---|---|---|---|
| 64 | 63 | 62 | 61 |
| 174-4 | 174-5 | 174-6 | 174-7 |
| 56 | 55 | 54 | 53 |
| 174-8 | 174-9 | 174-10 | 174-11 |
| 48 | 47 | 46 | 45 |
| 174-12 | 174-13 | 174-14 | 174-15 |
| 40 | 39 | 38 | 37 |

FIG. 6B

| 171-0 | 171-1 | 171-2 | 171-3 |
|---|---|---|---|
| 1 | 5 | 8 | 4 |
| 171-4 | 171-5 | 171-6 | 171-7 |
| 17 | 21 | 24 | 20 |
| 171-8 | 171-9 | 171-10 | 171-11 |
| 33 | 37 | 40 | 36 |
| 171-12 | 171-13 | 171-14 | 171-15 |
| 49 | 53 | 56 | 52 |

| 172-0 | 172-1 | 172-2 | 172-3 |
|---|---|---|---|
| 3 | 7 | 6 | 2 |
| 172-4 | 172-5 | 172-6 | 172-7 |
| 19 | 23 | 22 | 18 |
| 172-8 | 172-9 | 172-10 | 172-11 |
| 35 | 39 | 38 | 34 |
| 172-12 | 172-13 | 172-14 | 172-15 |
| 51 | 55 | 54 | 50 |

| 173-0 | 173-1 | 173-2 | 173-3 |
|---|---|---|---|
| 9 | 13 | 16 | 12 |
| 173-4 | 173-5 | 173-6 | 173-7 |
| 25 | 29 | 32 | 28 |
| 173-8 | 173-9 | 173-10 | 173-11 |
| 41 | 45 | 48 | 44 |
| 173-12 | 173-13 | 173-14 | 173-15 |
| 57 | 61 | 64 | 60 |

| 174-0 | 174-1 | 174-2 | 174-3 |
|---|---|---|---|
| 11 | 15 | 14 | 10 |
| 174-4 | 174-5 | 174-6 | 174-7 |
| 27 | 31 | 30 | 26 |
| 174-8 | 174-9 | 174-10 | 174-11 |
| 43 | 47 | 46 | 42 |
| 174-12 | 174-13 | 174-14 | 174-15 |
| 59 | 63 | 62 | 58 |

FIG. 6C

| 171-0 | 171-1 | 171-2 | 171-3 |
|---|---|---|---|
| 1 | 17 | 33 | 49 |
| 171-4 | 171-5 | 171-6 | 171-7 |
| 5 | 21 | 37 | 53 |
| 171-8 | 171-9 | 171-10 | 171-11 |
| 8 | 24 | 40 | 56 |
| 171-12 | 171-13 | 171-14 | 171-15 |
| 4 | 20 | 36 | 52 |

| 172-0 | 172-1 | 172-2 | 172-3 |
|---|---|---|---|
| 9 | 25 | 41 | 57 |
| 172-4 | 172-5 | 172-6 | 172-7 |
| 13 | 29 | 45 | 61 |
| 172-8 | 172-9 | 172-10 | 172-11 |
| 16 | 32 | 48 | 64 |
| 172-12 | 172-13 | 172-14 | 172-15 |
| 12 | 28 | 44 | 60 |

| 173-0 | 173-1 | 173-2 | 173-3 |
|---|---|---|---|
| 3 | 19 | 35 | 51 |
| 173-4 | 173-5 | 173-6 | 173-7 |
| 7 | 23 | 39 | 55 |
| 173-8 | 173-9 | 173-10 | 173-11 |
| 6 | 22 | 38 | 54 |
| 173-12 | 173-13 | 173-14 | 173-15 |
| 2 | 18 | 34 | 50 |

| 174-0 | 174-1 | 174-2 | 174-3 |
|---|---|---|---|
| 11 | 27 | 43 | 59 |
| 174-4 | 174-5 | 174-6 | 174-7 |
| 15 | 31 | 47 | 63 |
| 174-8 | 174-9 | 174-10 | 174-11 |
| 14 | 30 | 46 | 62 |
| 174-12 | 174-13 | 174-14 | 174-15 |
| 10 | 26 | 42 | 58 |

FIG. 7

| 171-0 $Y^1_0$ | 171-1 $Y^1_1$ | 171-2 $Y^1_2$ | 171-3 $Y^1_3$ |
|---|---|---|---|
| 171-4 $Y^1_8$ | 171-5 $Y^1_9$ | 171-6 $Y^1_{10}$ | 171-7 $Y^1_{11}$ |
| 171-8 $Y^1_{16}$ | 171-9 $Y^1_{17}$ | 171-10 $Y^1_{18}$ | 171-11 $Y^1_{19}$ |
| 171-12 $Y^1_{24}$ | 171-13 $Y^1_{25}$ | 171-14 $Y^1_{26}$ | 171-15 $Y^1_{27}$ |

↑ 141

| 172-0 $Y^1_7$ | 172-1 $Y^1_6$ | 172-2 $Y^1_5$ | 172-3 $Y^1_4$ |
|---|---|---|---|
| 172-4 $Y^1_{15}$ | 172-5 $Y^1_{14}$ | 172-6 $Y^1_{13}$ | 172-7 $Y^1_{12}$ |
| 172-8 $Y^1_{23}$ | 172-9 $Y^1_{22}$ | 172-10 $Y^1_{21}$ | 172-11 $Y^1_{20}$ |
| 172-12 $Y^1_{31}$ | 172-13 $Y^1_{30}$ | 172-14 $Y^1_{29}$ | 172-15 $Y^1_{28}$ |

↑ 142

| 173-0 $Y^1_{56}$ | 173-1 | 173-2 | 173-3 |
|---|---|---|---|
| 173-4 $Y^1_{48}$ | 173-5 $Y^1_{49}$ | 173-6 $Y^1_{50}$ | 173-7 $Y^1_{51}$ |
| 173-8 $Y^1_{40}$ | 173-9 $Y^1_{41}$ | 173-10 $Y^1_{42}$ | 173-11 $Y^1_{43}$ |
| 173-12 $Y^1_{32}$ | 173-13 $Y^1_{33}$ | 173-14 $Y^1_{34}$ | 173-15 $Y^1_{35}$ |

↑ 143

| 174-0 | 174-1 | 174-2 | 174-3 |
|---|---|---|---|
| 174-4 $Y^1_{55}$ | 174-5 $Y^1_{54}$ | 174-6 $Y^1_{53}$ | 174-7 $Y^1_{52}$ |
| 174-8 $Y^1_{47}$ | 174-9 $Y^1_{46}$ | 174-10 $Y^1_{45}$ | 174-11 $Y^1_{44}$ |
| 174-12 $Y^1_{39}$ | 174-13 $Y^1_{38}$ | 174-14 $Y^1_{37}$ | 174-15 $Y^1_{36}$ |

| 171-0<br>1, 5 | 171-1<br>9, 13 | 171-2<br>17, 21 | 171-3<br>25, 29 |
|---|---|---|---|
| 171-4<br>2, 6 | 171-5<br>10, 14 | 171-6<br>18, 22 | 171-7<br>26, 30 |
| 171-8<br>3, 7 | 171-9<br>11, 15 | 171-10<br>19, 23 | 171-11<br>27, 31 |
| 171-12<br>4, 8 | 171-13<br>12, 16 | 171-14<br>20, 24 | 171-15<br>28, 32 |

142

| 172-0<br>57, 61 | 172-1<br>49, 53 | 172-2<br>41, 45 | 172-3<br>33, 37 |
|---|---|---|---|
| 172-4<br>58, 62 | 172-5<br>50, 54 | 172-6<br>42, 46 | 172-7<br>34, 38 |
| 172-8<br>59, 63 | 172-9<br>51, 55 | 172-10<br>43, 47 | 172-11<br>35, 39 |
| 172-12<br>60, 64 | 172-13<br>52, 56 | 172-14<br>44, 48 | 172-15<br>36, 40 |

143

| 173-0<br>1, 5 | 173-1<br>9, 13 | 173-2<br>17, 21 | 173-3<br>25, 29 |
|---|---|---|---|
| 173-4<br>2, 6 | 173-5<br>10, 14 | 173-6<br>18, 22 | 173-7<br>26, 30 |
| 173-8<br>3, 7 | 173-9<br>11, 15 | 173-10<br>19, 23 | 173-11<br>27, 31 |
| 173-12<br>4, 8 | 173-13<br>12, 16 | 173-14<br>20, 24 | 173-15<br>28, 32 |

144

| 174-0<br>57, 61 | 174-1<br>49, 53 | 174-2<br>41, 45 | 174-3<br>33, 37 |
|---|---|---|---|
| 174-4<br>58, 62 | 174-5<br>50, 54 | 174-6<br>42, 46 | 174-7<br>34, 38 |
| 174-8<br>59, 63 | 174-9<br>51, 55 | 174-10<br>43, 47 | 174-11<br>35, 39 |
| 174-12<br>60, 64 | 174-13<br>52, 56 | 174-14<br>44, 48 | 174-15<br>36, 40 |

| 171-0<br>1, 5 | 171-1<br>17, 21 | 171-2<br>33, 37 | 171-3<br>49, 53 |
|---|---|---|---|
| 171-4<br>2, 6 | 171-5<br>18, 22 | 171-6<br>34, 38 | 171-7<br>50, 54 |
| 171-8<br>3, 7 | 171-9<br>19, 23 | 171-10<br>35, 39 | 171-11<br>51, 55 |
| 171-12<br>4, 8 | 171-13<br>20, 24 | 171-14<br>36, 40 | 171-15<br>52, 56 |

142

| 172-0<br>9, 13 | 172-1<br>25, 29 | 172-2<br>41, 45 | 172-3<br>57, 61 |
|---|---|---|---|
| 172-4<br>10, 14 | 172-5<br>26, 30 | 172-6<br>42, 46 | 172-7<br>58, 62 |
| 172-8<br>11, 15 | 172-9<br>27, 31 | 172-10<br>43, 47 | 172-11<br>59, 63 |
| 172-12<br>12, 16 | 172-13<br>28, 32 | 172-14<br>44, 48 | 172-15<br>60, 64 |

143

| 173-0<br>1, 5 | 173-1<br>17, 21 | 173-2<br>33, 37 | 173-3<br>49, 53 |
|---|---|---|---|
| 173-4<br>2, 6 | 173-5<br>18, 22 | 173-6<br>34, 38 | 173-7<br>50, 54 |
| 173-8<br>3, 7 | 173-9<br>19, 23 | 173-10<br>35, 39 | 173-11<br>51, 55 |
| 173-12<br>4, 8 | 173-13<br>20, 24 | 173-14<br>36, 40 | 173-15<br>52, 56 |

144

| 174-0<br>9, 13 | 174-1<br>25, 29 | 174-2<br>41, 45 | 174-3<br>57, 61 |
|---|---|---|---|
| 174-4<br>10, 14 | 174-5<br>26, 30 | 174-6<br>42, 46 | 174-7<br>58, 62 |
| 174-8<br>11, 15 | 174-9<br>27, 31 | 174-10<br>43, 47 | 174-11<br>59, 63 |
| 174-12<br>12, 16 | 174-13<br>28, 32 | 174-14<br>44, 48 | 174-15<br>60, 64 |

FIG. 9

| 171-0 $Y^2_0$ | 171-1 $Y^2_8$ | 171-2 $Y^2_{16}$ | 171-3 $Y^2_{24}$ |
|---|---|---|---|
| 171-4 $Y^2_1$ | 171-5 $Y^2_9$ | 171-6 $Y^2_{17}$ | 171-7 $Y^2_{25}$ |
| 171-8 $Y^2_2$ | 171-9 $Y^2_{10}$ | 171-10 $Y^2_{18}$ | 171-11 $Y^2_{26}$ |
| 171-12 $Y^2_3$ | 171-13 $Y^2_{11}$ | 171-14 $Y^2_{19}$ | 171-15 $Y^2_{27}$ |

| 172-0 $Y^2_{56}$ | 172-1 $Y^2_{48}$ | 172-2 $Y^2_{40}$ | 172-3 $Y^2_{32}$ |
|---|---|---|---|
| 172-4 $Y^1_{15}$ | 172-5 $Y^2_{49}$ | 172-6 $Y^2_{41}$ | 172-7 $Y^2_{33}$ |
| 172-8 $Y^1_{23}$ | 172-9 $Y^2_{50}$ | 172-10 $Y^2_{42}$ | 172-11 $Y^2_{34}$ |
| 172-12 $Y^1_{31}$ | 172-13 $Y^2_{51}$ | 172-14 $Y^2_{43}$ | 172-15 $Y^2_{35}$ |

| 173-0 $Y^2_7$ | 173-1 $Y^2_{15}$ | 173-2 $Y^2_{23}$ | 173-3 $Y^2_{31}$ |
|---|---|---|---|
| 173-4 $Y^2_6$ | 173-5 $Y^2_{14}$ | 173-6 $Y^2_{24}$ | 173-7 $Y^2_{30}$ |
| 173-8 $Y^2_5$ | 173-9 $Y^2_{13}$ | 173-10 $Y^2_{25}$ | 173-11 $Y^2_{29}$ |
| 173-12 $Y^2_4$ | 173-13 $Y^2_{12}$ | 173-14 $Y^2_{26}$ | 173-15 $Y^2_{28}$ |

| 174-0 $Y^1_{63}$ | 174-1 $Y^2_{55}$ | 174-2 $Y^2_{47}$ | 174-3 $Y^2_{39}$ |
|---|---|---|---|
| 174-4 $Y^1_{55}$ | 174-5 $Y^2_{54}$ | 174-6 $Y^2_{46}$ | 174-7 $Y^2_{38}$ |
| 174-8 $Y^1_{47}$ | 174-9 $Y^2_{53}$ | 174-10 $Y^2_{45}$ | 174-11 $Y^2_{37}$ |
| 174-12 $Y^1_{39}$ | 174-13 $Y^2_{52}$ | 174-14 $Y^2_{44}$ | 174-15 $Y^2_{36}$ |

FIG. 10

| 171-0 $Y^3_0$ | 171-1 $Y^3_1$ | 171-2 $Y^3_2$ | 171-3 $Y^3_3$ |
|---|---|---|---|
| 171-4 $Y^3_8$ | 171-5 $Y^3_9$ | 171-6 $Y^3_{10}$ | 171-7 $Y^3_{11}$ |
| 171-8 $Y^3_{16}$ | 171-9 $Y^3_{17}$ | 171-10 $Y^3_{18}$ | 171-11 $Y^3_{19}$ |
| 171-12 $Y^3_{24}$ | 171-13 $Y^3_{25}$ | 171-14 $Y^3_{26}$ | 171-15 $Y^3_{27}$ |

| 172-0 $Y^3_7$ | 172-1 $Y^3_6$ | 172-2 $Y^3_5$ | 172-3 $Y^3_4$ |
|---|---|---|---|
| 172-4 $Y^3_{15}$ | 172-5 $Y^3_{14}$ | 172-6 $Y^3_{13}$ | 172-7 $Y^3_{12}$ |
| 172-8 $Y^3_{23}$ | 172-9 $Y^3_{22}$ | 172-10 $Y^3_{21}$ | 172-11 $Y^3_{20}$ |
| 172-12 $Y^3_{31}$ | 172-13 $Y^3_{30}$ | 172-14 $Y^3_{29}$ | 172-15 $Y^3_{28}$ |

| 173-0 $Y^3_{56}$ | 173-1 $Y^2_{15}$ | 173-2 $Y^2_{23}$ | 173-3 $Y^2_{31}$ |
|---|---|---|---|
| 173-4 $Y^3_{48}$ | 173-5 $Y^3_{49}$ | 173-6 $Y^3_{50}$ | 173-7 $Y^3_{51}$ |
| 173-8 $Y^3_{40}$ | 173-9 $Y^3_{41}$ | 173-10 $Y^3_{42}$ | 173-11 $Y^3_{43}$ |
| 173-12 $Y^3_{32}$ | 173-13 $Y^3_{33}$ | 173-14 $Y^3_{34}$ | 173-15 $Y^3_{35}$ |

| 174-0 $Y^2_{63}$ | 174-1 $Y^2_{55}$ | 174-2 $Y^2_{47}$ | 174-3 $Y^2_{39}$ |
|---|---|---|---|
| 174-4 $Y^3_{55}$ | 174-5 $Y^3_{54}$ | 174-6 $Y^3_{53}$ | 174-7 $Y^3_{52}$ |
| 174-8 $Y^3_{47}$ | 174-9 $Y^3_{46}$ | 174-10 $Y^3_{45}$ | 174-11 $Y^3_{44}$ |
| 174-12 $Y^3_{39}$ | 174-13 $Y^3_{38}$ | 174-14 $Y^3_{37}$ | 174-15 $Y^3_{36}$ |

FIG. 11

| 171-0 $Y^1_0$ | 171-1 $Y^1_2$ | 171-2 $Y^1_4$ | 171-3 $Y^1_6$ |
|---|---|---|---|
| 171-4 $Y^1_{16}$ | 171-5 $Y^1_{18}$ | 171-6 $Y^1_{20}$ | 171-7 $Y^1_{22}$ |
| 171-8 $Y^1_{32}$ | 171-9 $Y^1_{34}$ | 171-10 $Y^1_{36}$ | 171-11 $Y^1_{38}$ |
| 171-12 $Y^1_{48}$ | 171-13 $Y^1_{50}$ | 171-14 $Y^1_{52}$ | 171-15 $Y^1_{54}$ |

| 172-0 $Y^1_1$ | 172-1 $Y^1_3$ | 172-2 $Y^1_5$ | 172-3 $Y^1_7$ |
|---|---|---|---|
| 172-4 $Y^1_{17}$ | 172-5 $Y^1_{19}$ | 172-6 $Y^1_{21}$ | 172-7 $Y^1_{23}$ |
| 172-8 $Y^1_{33}$ | 172-9 $Y^1_{35}$ | 172-10 $Y^1_{37}$ | 172-11 $Y^1_{39}$ |
| 172-12 $Y^1_{49}$ | 172-13 $Y^1_{51}$ | 172-14 $Y^1_{53}$ | 172-15 $Y^1_{55}$ |

| 173-0 $Y^1_8$ | 173-1 $Y^1_{10}$ | 173-2 $Y^1_{12}$ | 173-3 $Y^1_{14}$ |
|---|---|---|---|
| 173-4 $Y^1_{24}$ | 173-5 $Y^1_{26}$ | 173-6 $Y^1_{28}$ | 173-7 $Y^1_{30}$ |
| 173-8 $Y^1_{40}$ | 173-9 $Y^1_{42}$ | 173-10 $Y^1_{44}$ | 173-11 $Y^1_{46}$ |
| 173-12 | 173-13 | 173-14 | 173-15 |

| 174-0 $Y^1_9$ | 174-1 $Y^1_{11}$ | 174-2 $Y^1_{13}$ | 174-3 $Y^1_{15}$ |
|---|---|---|---|
| 174-4 $Y^1_{25}$ | 174-5 $Y^1_{27}$ | 174-6 $Y^1_{29}$ | 174-7 $Y^1_{31}$ |
| 174-8 $Y^1_{41}$ | 174-9 $Y^1_{43}$ | 174-10 $Y^1_{45}$ | 174-11 $Y^1_{47}$ |
| 174-12 | 174-13 | 174-14 | 174-15 |

FIG. 12

| 171-0 $Y^2_0$ | 171-1 $Y^2_{16}$ | 171-2 $Y^2_{32}$ | 171-3 $Y^2_{48}$ |
|---|---|---|---|
| 171-4 $Y^2_2$ | 171-5 $Y^2_{18}$ | 171-6 $Y^2_{34}$ | 171-7 $Y^2_{50}$ |
| 171-8 $Y^2_4$ | 171-9 $Y^2_{20}$ | 171-10 $Y^2_{36}$ | 171-11 $Y^2_{52}$ |
| 171-12 $Y^2_6$ | 171-13 $Y^2_{22}$ | 171-14 $Y^2_{38}$ | 171-15 $Y^2_{54}$ |

| 172-0 $Y^2_8$ | 172-1 $Y^2_{24}$ | 172-2 $Y^2_{40}$ | 172-3 $Y^1_7$ |
|---|---|---|---|
| 172-4 $Y^2_{10}$ | 172-5 $Y^2_{26}$ | 172-6 $Y^2_{42}$ | 172-7 $Y^1_{23}$ |
| 172-8 $Y^2_{12}$ | 172-9 $Y^2_{28}$ | 172-10 $Y^2_{44}$ | 172-11 $Y^1_{39}$ |
| 172-12 $Y^2_{14}$ | 172-13 $Y^2_{30}$ | 172-14 $Y^2_{46}$ | 172-15 $Y^1_{55}$ |

| 173-0 $Y^2_1$ | 173-1 $Y^2_{17}$ | 173-2 $Y^2_{33}$ | 173-3 $Y^2_{49}$ |
|---|---|---|---|
| 173-4 $Y^2_3$ | 173-5 $Y^2_{19}$ | 173-6 $Y^2_{35}$ | 173-7 $Y^2_{51}$ |
| 173-8 $Y^2_5$ | 173-9 $Y^2_{21}$ | 173-10 $Y^2_{37}$ | 173-11 $Y^2_{53}$ |
| 173-12 $Y^2_7$ | 173-13 $Y^2_{23}$ | 173-14 $Y^2_{39}$ | 173-15 $Y^2_{55}$ |

| 174-0 $Y^2_9$ | 174-1 $Y^2_{25}$ | 174-2 $Y^2_{41}$ | 174-3 $Y^1_{15}$ |
|---|---|---|---|
| 174-4 $Y^2_{11}$ | 174-5 $Y^2_{27}$ | 174-6 $Y^2_{43}$ | 174-7 $Y^1_{31}$ |
| 174-8 $Y^2_{13}$ | 174-9 $Y^2_{29}$ | 174-10 $Y^2_{45}$ | 174-11 $Y^1_{47}$ |
| 174-12 $Y^2_{15}$ | 174-13 $Y^2_{31}$ | 174-14 $Y^2_{47}$ | 174-15 $Y^1_{63}$ |

FIG. 13

| 171-0 $Y^3_0$ | 171-1 $Y^3_2$ | 171-2 $Y^3_4$ | 171-3 $Y^3_6$ |
|---|---|---|---|
| 171-4 $Y^3_{16}$ | 171-5 $Y^3_{18}$ | 171-6 $Y^3_{20}$ | 171-7 $Y^3_{22}$ |
| 171-8 $Y^3_{32}$ | 171-9 $Y^3_{34}$ | 171-10 $Y^3_{36}$ | 171-11 $Y^3_{38}$ |
| 171-12 $Y^3_{48}$ | 171-13 $Y^3_{50}$ | 171-14 $Y^3_{52}$ | 171-15 $Y^3_{54}$ |

| 172-0 $Y^3_1$ | 172-1 $Y^3_3$ | 172-2 $Y^3_5$ | 172-3 $Y^3_7$ |
|---|---|---|---|
| 172-4 $Y^3_{17}$ | 172-5 $Y^3_{19}$ | 172-6 $Y^3_{21}$ | 172-7 $Y^3_{23}$ |
| 172-8 $Y^3_{33}$ | 172-9 $Y^3_{35}$ | 172-10 $Y^3_{37}$ | 172-11 $Y^3_{39}$ |
| 172-12 $Y^3_{49}$ | 172-13 $Y^3_{51}$ | 172-14 $Y^3_{53}$ | 172-15 $Y^3_{55}$ |

| 173-0 $Y^3_8$ | 173-1 $Y^3_{10}$ | 173-2 $Y^3_{12}$ | 173-3 $Y^3_{14}$ |
|---|---|---|---|
| 173-4 $Y^3_{24}$ | 173-5 $Y^3_{26}$ | 173-6 $Y^3_{28}$ | 173-7 $Y^3_{30}$ |
| 173-8 $Y^3_{40}$ | 173-9 $Y^3_{42}$ | 173-10 $Y^3_{44}$ | 173-11 $Y^3_{46}$ |
| 173-12 $Y^2_7$ | 173-13 $Y^2_{23}$ | 173-14 $Y^2_{39}$ | 173-15 $Y^2_{55}$ |

| 174-0 $Y^3_9$ | 174-1 $Y^3_{11}$ | 174-2 $Y^3_{13}$ | 174-3 $Y^3_{15}$ |
|---|---|---|---|
| 174-4 $Y^3_{25}$ | 174-5 $Y^3_{27}$ | 174-6 $Y^3_{29}$ | 174-7 $Y^3_{15}$ |
| 174-8 $Y^3_{41}$ | 174-9 $Y^3_{43}$ | 174-10 $Y^3_{45}$ | 174-11 $Y^3_{47}$ |
| 174-12 $Y^2_{15}$ | 174-13 $Y^2_{31}$ | 174-14 $Y^2_{47}$ | 174-15 $Y^2_{63}$ |

TRANSPOSE MEMORY FOR DCT/IDCT CIRCUIT

RELATED PATENTS AND PATENT APPLICATIONS

The following patents and patent applications are assigned to the assignee hereof:

1. U.S. Pat. No. 5,226,002, entitled "Matrix Multiplier Circuit" filed Jun. 28, 1991 for Hug-Di Wu, Rong-Yean Lee and Maing-Ku Yang;

2. U.S. Pat. No. 5,204,830, entitled "Fast Pipelined Matrix Multiplier" filed Feb. 13, 1992 for Jinn-Shyan Wang and Jinn-Nan Kao;

3. U.S. patent application Ser. No. 07/948,237, entitled "Algorithm and Circuits for Matrix Multiplication" filed Sep. 21, 1992 for Jinn-Nan Kao; and 4. U.S. patent application Ser. No. 08/121,598, entitled "Fast Pipelined 2-D Discrete Cosine Transform Architecture" filed Sep. 15, 1993 for Jinn-Nan Kao.

The above-listed patents and patent applications contain subject matter related to the present application and are incorporated herein by reference.

FIELD OF THE INVENTION

The present invention relates to circuits which may be used in compressing video signals. In particular, the present invention relates to a novel transpose memory which may be inserted in between two one dimension transform circuits, such as discrete cosine transform (DCT) or inverse discrete cosine transform circuits (IDCT).

BACKGROUND OF THE INVENTION

The Discrete Cosine Transform (DCT) is a frequently used operation in several applications. For example, it is advantageous in the area of video image data compression to apply a two dimensional (2-D) DCT to inputted video data. The 2-D DCT is defined as:

$$z_{mn} = \frac{4}{N^2} c(m)c(n) \sum_{i=0}^{N-1} \sum_{j=0}^{N-1} x_{ij} \cos\frac{(2i+1)m\pi}{2N} \cos\frac{(2j+1)n\pi}{2N} \quad (1)$$

where $x_{ij}$ are input elements in an N×N matrix, with i,j=0, 1,2, ..., N−1 and where $z_{mn}$ are output elements in an N×N matrix with m,n=0,1,2, ..., N−1 and where:

$$c(m), c(n) = \begin{cases} \frac{1}{\sqrt{2}} & m=0\, n=0 \\ 1, & \text{otherwise} \end{cases}$$

The Inverse Discrete Cosine Transform (IDCT) is defined as:

$$x_{ij} = \sum_{m=0}^{N-1} \sum_{n=0}^{N-1} c(m)c(n) z_{mn} \cos\frac{(2i+1)m\pi}{2N} \cos\frac{(2j+1)n\pi}{2N} \quad (2)$$

The matrix expression for equation (1) is $$Z = CXC^t \quad (3)$$

where X is the input data matrix, C is the cosine transform matrix and $C^t$ is the transpose of the matrix C. If the input matrix X is an N×N matrix, then equation (3) may be expressed as:

$$\begin{bmatrix} Z_{11}Z_{12} & \ldots & Z_{1N} \\ Z_{21}Z_{22} & \ldots & Z_{2N} \\ & \vdots & \\ Z_{N1}Z_{N2} & \ldots & Z_{NN} \end{bmatrix} = \begin{bmatrix} C_{11}C_{12} & \ldots & C_{1N} \\ C_{21}C_{22} & \ldots & C_{NN} \\ & \vdots & \\ C_{N1}C_{N2} & \ldots & C_{NN} \end{bmatrix} \begin{bmatrix} X_{11}X_{12} & \ldots & X_{1N} \\ X_{21}X_{22} & \ldots & X_{2N} \\ & \vdots & \\ X_{N1}X_{N2} & \ldots & X_{NN} \end{bmatrix} \begin{bmatrix} C_{11}C_{21} & \ldots & C_{N1} \\ C_{12}C_{22} & \ldots & C_{N2} \\ & \vdots & \\ C_{1N}C_{2N} & \ldots & C_{NN} \end{bmatrix} \quad (4)$$

The computation of the IDCT is similar to that of the DCT except that the matrix $C^t$ is substituted for the matrix C and vice versa. Therefore, the discussion may continue with only the DCT without loss of generality. Equation (3) may be divided into one dimensional transforms as follows:

$$Y = CX \quad (5)$$

$$Z = YC^t \quad (6)$$

where Y is an intermediate product matrix or intermediate matrix and $C^t$ is the transpose of the cosine coefficient matrix C. Likewise from equation (6) the following is also true:

$$Z = CY^t \quad (6a)$$

where $Y^t$ is the transpose of the intermediate matrix Y. (Likewise, for an IDCT, we have:

$$X = C^t Y \text{ or } X = Y^t c \quad (6b))$$

There are several conventional techniques and circuits for performing a DCT of an inputted data matrix. N. Ahmed, T. Natarajan & K. Rao, "Discrete Cosine Transform," IEEE Trans. on Computers, vol. C-23, Jan., 1974, 90–93 teaches a general DCT technique. N. Cho & S. Lee, "Fast Algorithm and Implementation of 2-D Discrete Cosine Transform," IEEE Trans. on Cir. & Sys., vol. 38, no. 3, Mar. 1991, p. 297–305 discloses a circuit that computes an 2-D N×N DCT using N 1-D DCT circuits or with multiplexers and N/2 1-D DCT circuits. M. Sun, T. Chen & A. Gottlieb, "VLSI Implementation of a 16×16 Discrete Cosine Transform," IEEE Trans. on Cir. & Sys., vol. 36, no. 4, Apr., 1989, p.610-17 teaches a 2-D DCT circuit with DCT stages having a memory for storing partial results in the matrix calculations of 1-D DCT's. H. Hou, "A Fast Recursive Algorithm For Computing the Discrete Cosine Transform," IEEE Trans. on Acoustics, Speech and Signal Processing, vol. ASSP-35, no. 10, Oct., 1987, p.1455–61 teaches a decimation technique which exploits symmetry properties of the DCT coefficient matrix in order to reduce the number of multiplications of the transformation. More specifically, equation (5) can be rewritten as follows:

$$\begin{bmatrix} Y_o \\ Y_e \end{bmatrix} = \begin{bmatrix} C_1 & C_1 \\ C_2 & -C_2 \end{bmatrix} \begin{bmatrix} X_f \\ X_r \end{bmatrix} \quad (7)$$

where $Y_e$ is a matrix containing the even rows of the matrix Y, $Y_o$ is a matrix containing the odd rows of the matrix Y, $X_f$ is a matrix containing the front rows (in the upper half) of the matrix X, $X_r$ is a matrix containing the recent rows, in reverse order, (in the lower half) of the matrix X and $C_1$ and $C_2$ are N/2×N/2 DCT coefficient matrices. For example, in an 8×8 DCT, equation 7 may be rewritten as:

$$\begin{bmatrix} Y_0 \\ Y_2 \\ Y_4 \\ Y_6 \end{bmatrix} = \begin{bmatrix} A & A & A & A \\ B & C & -C & -B \\ A & -A & -A & A \\ C & -B & B & -C \end{bmatrix} \begin{bmatrix} X_0 + X_7 \\ X_1 + X_6 \\ X_2 + X_5 \\ X_3 + X_4 \end{bmatrix} \quad (7a)$$

$$\begin{bmatrix} Y_1 \\ Y_3 \\ Y_5 \\ Y_7 \end{bmatrix} = \begin{bmatrix} D & E & F & G \\ E & -G & -D & -F \\ F & -D & G & E \\ G & -F & E & -D \end{bmatrix} \begin{bmatrix} X_0 + X_7 \\ X_1 + X_6 \\ X_2 + X_5 \\ X_3 + X_4 \end{bmatrix} \quad (7b)$$

$Y_0, Y_1, \ldots, Y_7$ are rows of the intermediate matrix Y and $x_0, x_1, \ldots, x_7$ are rows of the input data matrix X. Likewise, the IDCT may be written as follows:

$$\begin{bmatrix} X_f \\ X_r \end{bmatrix} = \begin{bmatrix} C_1^t & C_2^t \\ C_1^t & -C_2^t \end{bmatrix} \begin{bmatrix} Y_o \\ Y_e \end{bmatrix} \quad (8)$$

where $C_1^t$ is the transpose of $C_1$ and $C_2^t$ is the transpose of $C_2$. For example, in an 8×8 IDCT, equation 8 may be rewritten as:

$$\begin{bmatrix} X_0 \\ X_1 \\ X_2 \\ X_3 \end{bmatrix} = \begin{bmatrix} A & A & A & A \\ B & C & -C & -B \\ A & -A & -A & A \\ C & -B & B & -C \end{bmatrix} \begin{bmatrix} Y_0 \\ Y_2 \\ Y_4 \\ Y_6 \end{bmatrix} + \begin{bmatrix} D & E & F & G \\ E & -G & -D & -F \\ F & -D & G & E \\ G & -F & E & -D \end{bmatrix} \begin{bmatrix} Y_1 \\ Y_3 \\ Y_5 \\ Y_7 \end{bmatrix} \quad (8a)$$

$$\begin{bmatrix} X_7 \\ X_6 \\ X_5 \\ X_4 \end{bmatrix} = \begin{bmatrix} A & A & A & A \\ B & C & -C & -B \\ A & -A & -A & A \\ C & -B & B & -C \end{bmatrix} \begin{bmatrix} Y_0 \\ Y_2 \\ Y_4 \\ Y_6 \end{bmatrix} + \begin{bmatrix} D & E & F & G \\ E & -G & -D & -F \\ F & -D & G & E \\ G & -F & E & -E \end{bmatrix} \begin{bmatrix} Y_1 \\ Y_3 \\ Y_5 \\ Y_7 \end{bmatrix} \quad (8b)$$

Equations 7, (7a), (8b) and 8, (8a), (8b) are also applicable in determining $Z=CY^t$ as in Equation 6(a) or its analog in IDCT Y=ZC.

Equations (7a), (7b), (8a) and 8(b) provide an advantage in that the number of multiplications necessary to determine each 1-D DCT is reduced by 50%.

FIG. 1 shows one 2-D DCT/IDCT architecture. See U.S. Pat. No. 4,791,598. As shown, the circuit has a first 1-D DCT (or IDCT) circuit 3 which receives an input data matrix X (or 2-D transformed matrix Z) on lines $n_1$. The 1-D DCT circuit 3 transforms the inputted data matrix according to equation (6a) or (7a)–(7b) (or (6b) or (8a)–(8b)) and outputs an intermediate product matrix Y on lines $n_2$ to a transpose memory 5. The transpose memory 5 transposes the intermediate product matrix Y and outputs the transpose of the intermediate product matrix $Y^5$ on lines $n_3$ to a second 1-D DCT circuit 7. The second 1-D DCT transform circuit 7 outputs a 2-D transformed output matrix Z according to equation 6(a) or (7a)–(7b) (or (6b) or (8a)-(8b)) on lines $n_4$.

In the case of a DCT circuit, the 1-D DCT circuit outputs a row-column ordered sequence i.e., $y_0, y_1, y_2, \ldots, y_{63}$. (Herein, as a matter of convenience, an 8×8 matrix is assumed wherein matrix elements $y_{ij}$, for i,j=0,1,2,...,7 will be referred to using single number subscripts as follows: )

$$\begin{bmatrix} y_0 & y_1 & y_2 & y_3 & y_4 & y_5 & y_6 & y_7 \\ y_8 & y_9 & y_{10} & y_{11} & y_{12} & y_{13} & y_{14} & y_{15} \\ y_{16} & y_{17} & y_{18} & y_{19} & y_{20} & y_{21} & y_{22} & y_{23} \\ y_{24} & y_{25} & y_{26} & y_{27} & y_{28} & y_{29} & y_{30} & y_{31} \\ y_{32} & y_{33} & y_{34} & y_{35} & y_{36} & y_{37} & y_{38} & y_{39} \\ y_{40} & y_{41} & y_{42} & y_{43} & y_{44} & y_{45} & y_{46} & y_{47} \\ y_{48} & y_{49} & y_{50} & y_{51} & y_{52} & y_{53} & y_{54} & y_{55} \\ y_{56} & y_{57} & y_{58} & y_{59} & y_{60} & y_{61} & y_{62} & y_{63} \end{bmatrix}$$

The transpose memory 5 writes out the data in transposed order, in this case column-row order, i.e., $y_0, y_8, y_8, y_{16}, y_{32}, \ldots, y_1, y_9, y_{17}, y_{25}, y_{33}, \ldots, y_{63}$. However, an inspection of equation (7a)–(7b), reveals that a 1-D decimation technique DCT circuit 7 requires two elements of the intermediate matrix Y at a time in the order $(y_0, y_{56}), (y_8, y_{48}), (y_{16}, y_{40}), \ldots, (y_1, y_{57}), (y_9, y_{49}), \ldots, (y_{31}, y_{39})$ (referred to herein as "shuffled column-row order"). Furthermore, it is often desirable to separately apply equations (7a) and (7b) (or (8a) and (8b), in the case of an IDCT) to each data pair successively, rather than simultaneously. This allows using a smaller matrix multiplier in the circuit 7 without significantly affecting the throughput. In such a case, each column of element pairs of the outputted sequence is outputted twice, i.e., the following sequence is outputted: $(y_0, y_{56}), (y_8, y_{48}), \ldots, (y_{24}, y_{32}), (y_0, y_{56}), (y_8, y_{48}), \ldots, (y_{24}, y_{32}), (y_1, y_{57}), (y_9, y_{49}), \ldots, (y_{25}, y_{33}), (y_1, y_{57}), (y_9, y_{49}), \ldots, (y_{25}, y_{33}), \ldots, (y_{31}, y_{39})$.

The sequence outputted from the transpose memory is received at a pre-processing circuit 7a containing an ALU 7b and shift-in parallel-out registers 7c. The shift-in parallel-out registers 7c receive each column outputted from the transpose memory 5 and output two elements, in parallel, in shuffled column-row order.

In the case of an IDCT, the 1-D IDCT circuit 3 outputs the elements of the matrix Y in the order $y_0, y_7, y_1, y_6, y_2, y_5, \ldots, y_8, y_{15}, y_9, y_{14}, \ldots, y_{59}, y_{60}$ (referred to herein as "shuffled row-column order"). The transpose memory thus outputs the elements in transposed order, i.e., shuffled column-row order $y_0, y_{56}, y_8, y_{48}, y_{16}, y_{40}, \ldots, y_1, y_{57}, y_9, y_{49}, \ldots, y_{31}, y_{39}$. However, an inspection of equations (8a)–(8b) reveals that a 1-D IDCT decimation technique circuit requires two elements per cycle in column-row order, i.e., $(y_0, y_8), (y_{16}, y_{24}), \ldots, (y_1, y_9), (y_{17}, y_{25}), \ldots, (y_{55}, y_{63})$ (or, advantageously, repeated row-column order: $(y_0, y_8), (y_{16}, y_{24}), \ldots, (y_{48}, y_{56}), (y_0, y_8), (y_{16}, y_{24}), \ldots, (y_{48}, y_{56}), (y_1, y_9), (y_{17}, y_{25}), \ldots, (y_{49}, y_{57}), (y_1, y_9), (y_{17}, y_{25}), \ldots$ ..., $(y_{49}, y_{57})$, ..., $(y_{55}, y_{63})$). Again, the shift-in parallel-out registers 7c of the pre-processor circuit 7a receive each column in shuffled column-row order outputted from the transpose memory 5 and outputs two elements per cycle in column-row order.

It is desirable to implement the architecture shown in FIG. 1 in a fashion which is fully pipelined, i.e., such the flow of intermediate matrices Y from the first 1-D DCT 3, to the transpose memory 5, to the second 1-D DCT 7 is continuous without stoppages. However, the transpose memory 5 is a potential bottleneck. This because of the actual transpose operation performed by the transpose memory 5. For example, data may be written in the transpose memory 5 in row-column order. The data is then read out in the column-row or shuffled column-row order. The time to write the data in the transpose memory 5 is T and the time to read out the data from the transpose memory 5 is T. Thus, a conventional transpose memory utilizes a time 2T to process each matrix Y.

In order to reduce this processing time, several conventional transpose memories have been proposed. In a first conventional architecture, two transpose memories are provided which are used to alternately process each inputted intermediate matrix Y. That is, during a first phase, a first transpose memory writes a first intermediate matrix Y1 therein according to, e.g., row-column ordering. During a second phase, the second transpose memory writes a second intermediate matrix Y2 therein according to row-column ordering. While writing the second intermediate matrix Y2, the first transpose memory reads-out the intermediate matrix Y1 according to column-row ordering. Likewise, during a third phase, the first transpose memory writes a third intermediate matrix Y3 therein in row-column order and the second transpose memory reads-out the second intermediate matrix Y2 in column-row order. This transpose memory is disadvantageous because two memories are required.

FIG. 2 shows a different conventional approach which is disclosed in U.S. Pat. No. 4,791,598. As shown, the transpose memory 5 has a column of shift registers 13 and a column of parallel registers 15 connected at its output. The matrix Y is shifted into the shift register column 13 in column-row order so that each column register 13-1, 13-2, ..., 13-N receives a corresponding row of matrix elements of Y. When the entire matrix is loaded into the shift register column 13, the individual registers 13-1, 13-2, ..., 13-N transfer their contents in parallel to corresponding parallel registers 15-1, 15-2, ..., 15-N connected thereto. Form there, the data in the parallel registers may be fed to a combined core processor-ALU 17. In the meantime, the shift register column 13 is immediately available to receive the next intermediate product matrix Y. This architecture is disadvantageous because many space wasting registers are required.

U.S. Pat. No. 5,053,985 teaches another architecture which is shown in FIG. 3. An input data matrix X is processed by a 1-D DCT circuit 20 which can process data at twice the rate at which the matrix X is inputted. As shown, the 1-D DCT circuit 20 includes a first circuit containing pre-registers and an ALU 30 for preprocessing the data, multiplier and accumulators 35 for performing row-column matrix multiplication and a second circuit containing post-registers and an ALU 40 for post-processing the data. The intermediate matrix Y produced by the 1-D DCT circuit 20 is stored in a RAM 60, e.g., in row-column order. The data is then read out of the RAM 60 in column-row order and processed again by the 1-D DCT circuit 20 at twice the rate at which the matrix X is inputted. However, while a 100 MHZ DCT processor is known from S. Uramoto, Y. Inoue, A. Takabatake, J. Takeda, Y. Yamashita, H. Terane and M. Yoshimoto, "A 100-MHz 2-D Discrete Cosine Transform Core Processor" I.E.E.E J. OF SOLID STATE CIRS., VOl. 27, no. 4, Apr. 1992, p. 429-99, the input data rate is limited to ½ of the processor speed.

U.S. Pat. Nos. 5,042,007 and 5,177,704 show transpose memory architectures which use shift registers connected to form FIFO (first-in first-out) memories. In both of these patents, the transpose memories themselves are formed using $(N^2+1)$ n-bit shift registers and $(2N^2-2)$ 2-to-1 multiplexers. The multiplexers and shift registers are connected in a configuration for transposing an inputted intermediate matrix. Likewise, U.S. Pat. No. 4,903,231 teaches another transpose memory formed by interconnecting $N^2$ shift registers and approximately $N^2$ multiplexers. U.S. Pat. No. 4,903,231 also teaches that elements may be shifted in and out in row-column or column-row order. These architectures are disadvantageous because many space consuming registers and multiplexers are required.

U.S. Pat. No. 4,769,790 teaches a transpose circuit in which the columns (rows) of an inputted matrix are inputted in parallel to a delay circuit which delays each column a different number of cycles. The delayed columns are sequentially inputted to a distribution circuit which rotates the delayed elements received each cycle a number of columns depending on the cycle in which the elements are received. The rotated columns are outputted to a second delay circuit which delays each of the rotated columns. Like the other architectures mentioned above, this architecture requires many space consuming shift registers in each delay circuit and thus occupies a great deal of space.

U.S. Pat. No. 4,918,527 teaches a transpose memory in which a memory is partitioned into two separately accessible halves or planes. Data is written in one half plane while data is read out of the other half plane. Furthermore, the data is stored in the two half-planes such that data of odd rows are permutated two-by-two, i.e., in each odd row, the intermediate matrix is stored such that the elements of each pair of columns are swapped. The disadvantage of this architecture is that a pre-processing unit, having many registers, is required to convert the outputted sequence of individual matrix elements into a sequence of matrix element pairs. Furthermore, the architecture requires extensive space consuming pre and post-decoders including at least nine logic gates for each stored matrix element.

The primary disadvantage of the prior art architectures is that they occupy a great deal of space. This is an important consideration if the 2-D DCT or IDCT circuit is to be formed on a single integrated circuit (IC) chip. Furthermore, none of the above architectures provides for fully flexible write and read orderings. That is, none of the above architectures provide for writing a matrix into, and subsequently reading the matrix from, the transpose memory according to any combination of read and write orderings (i.e., row-column, column-row, shuffled row-column, shuffled column-row). In the very least, the pre-and post-processing registers and ALUs, transpose memory and 1-D transform circuits must be completely emptied before the order of in which the input matrices are received or in which the output matrices are outputted can be changed.

It is therefore an object of the present invention to overcome the disadvantages of the prior art.

SUMMARY OF THE INVENTION

These and other objects are achieved by the present invention. According to one embodiment, a transpose memory is provided for receiving elements of a matrix according to a first order. The transpose memory is capable of outputting the received matrix elements to a first or second type of transform circuit, e.g., a DCT or IDCT transform circuit, according to a second order. The transpose memory has four dual port memories which illustratively are dual port RAMs. Each dual port memory has a number of storage cells including one storage cell for storing each element of one fourth of the received matrix. The transpose memory also has a first counter for writing each received matrix element in a particular storage cell of a particular memory. Furthermore, the transpose memory has a second counter for reading out pairs of elements according to the second order.

The particular dual port memory in which the first counter writes each matrix element is selected to facilitate simultaneous reading-out of matrix element pairs without the need of space consuming registers or many logic gates. If the received matrix is to be outputted to the first type of transform circuit, each of the dual port memories is assigned to one quadrant or one corner of the received matrix. In such a case, the first counter writes each matrix element in a particular dual port memory assigned to the quadrant of the matrix element. That is, matrix elements in front rows and front columns (upper left corner) of the matrix are written in a first memory. Elements in front rows and recent columns (upper right corner) of the matrix are written in a second memory. Elements in recent rows and front columns (lower left corner) of the matrix are written in a third memory. Elements in recent rows and recent columns (lower right corner) of the matrix are written in the fourth memory. If the received matrix is to be outputted to the second type of transform circuit, each of the dual port memories is assigned to alternating rows and columns of the received matrix. In such a case, the first counter writes each matrix element in a particular dual port memory assigned to the "evenness" or "oddness" (i.e., divisibleness by two) of the row and column of the matrix element. That is, matrix elements in odd rows and odd columns of the matrix are written in a first memory. Elements in odd rows and even columns of the matrix are written in a second memory. Elements in even rows and odd columns of the matrix are written in a third memory. Elements in even rows and even columns of the matrix are written in the fourth memory.

Illustratively, the writing of elements in a memory corresponding to the quadrant of the matrix element allows simultaneous reading-out of element pairs in a shuffled order, i.e., shuffled row-column or shuffled column-row. This is because, each element of each pair to be read-out is stored in a different memory. For instance, the elements $y_0$, $y_8$, $y_{16}$, and $y_{24}$ of the upper left quadrant of a matrix are written in a first dual port memory and the elements $y_{32}$, $y_{40}$, $y_{48}$, and $y_{56}$ of a lower left quadrant are written in a second dual port memory. Thus, the second counter can easily read out each element of each pair $(y_0, y_{56})$, $(y_8, y_{48})$, $(y_{16}, y_{40})$ and $(y_{24}, y_{32})$ of the shuffled column-row ordered sequence because each element of each pair is stored in a different dual port memory. Likewise, the writing of each matrix element in a particular memory assigned to the evenness or oddness of the row and column of the matrix element allows simultaneous reading-out of element pairs in non-shuffled order, i.e., non-shuffled row-column or column-row order. For instance, the elements $y_0$, $y_{16}$, $y_{32}$, and $y_{48}$ and $y_{48}$ in odd rows of a matrix are written in a first dual port memory and the elements $y_8$, $y_{24}$, $y_{40}$, and $y_{56}$ in even rows are written in a second dual port memory. Thus, the second counter can easily read out each element of each pair $(y_0, y_8)$, $(y_{16}, y_{24})$, $(y_{32}, y_{40})$ and $(y_{48}, y_{56})$ of the shuffled column-row ordered sequence because each element of each pair is stored in a different dual port memory.

Illustratively, the transpose memory of the present invention is inserted in between two one-dimensional transform circuits. The transpose memory can be inserted between two transform circuits of the same type, e.g., between two DCT or two IDCT transform circuits. In such a case, the first and second counters can be synchronized in relation to the inputted matrix elements to provide pipeline transpose operation. That is, the first counter can simultaneously write received matrix elements in the dual port memories while the second counter simultaneously reads-out previously written matrix elements. Illustratively, the second counter vacates, i.e., reads-out elements of a previously stored matrix from, storage cells of the memories prior to the first counter writing elements of a subsequently received matrix therein. In an alternative embodiment, the transpose memory can receive elements from one type of transform circuit and output the elements to, and in an order suitable for, a different type of transform circuit.

In short, a transpose memory is provided which can be implemented with four low area occupying memories, two counters and a limited amount of glue logic circuits. The transpose memory occupies little area on an IC chip yet is capable of outputting elements according to one of a number of possible orders regardless of the input order.

BRIEF DESCRIPTION OF THE DRAWINGS

FIG. 7 illustrates the state of the transpose memory of FIG. 5 after writing part of a first matrix therein using the write counter order of FIG. 6(a).

FIG. 9 illustrates the state of the transpose memory of FIG. 5 after writing part of a second matrix therein using the write counter order of FIG. 6(d) and reading-out the first matrix using the read counter order of FIG. 8(a).

FIG. 10 illustrates the state of the transpose memory of FIG. 5 after writing part of a third matrix therein using the write counter order of FIG. 6(a) and reading-out the second matrix using the read counter order of FIG. 8(d).

FIG. 11 illustrates the state of the transpose memory of FIG. 5 after writing part of a first matrix therein using the write counter order of FIG. 6(b).

FIG. 12 illustrates the state of the transpose memory of FIG. 5 after writing part of a second matrix therein using the write counter order of FIG. 6(c) and reading-out the first matrix using the read counter order of FIG. 8(b).

FIG. 13 illustrates the state of the transpose memory of FIG. 5 after writing part of a third matrix therein using the write counter order of FIG. 6(b) and reading-out the second matrix using the read counter order of FIG. 8(c).

DETAILED DESCRIPTION OF THE INVENTION

Figure 1:
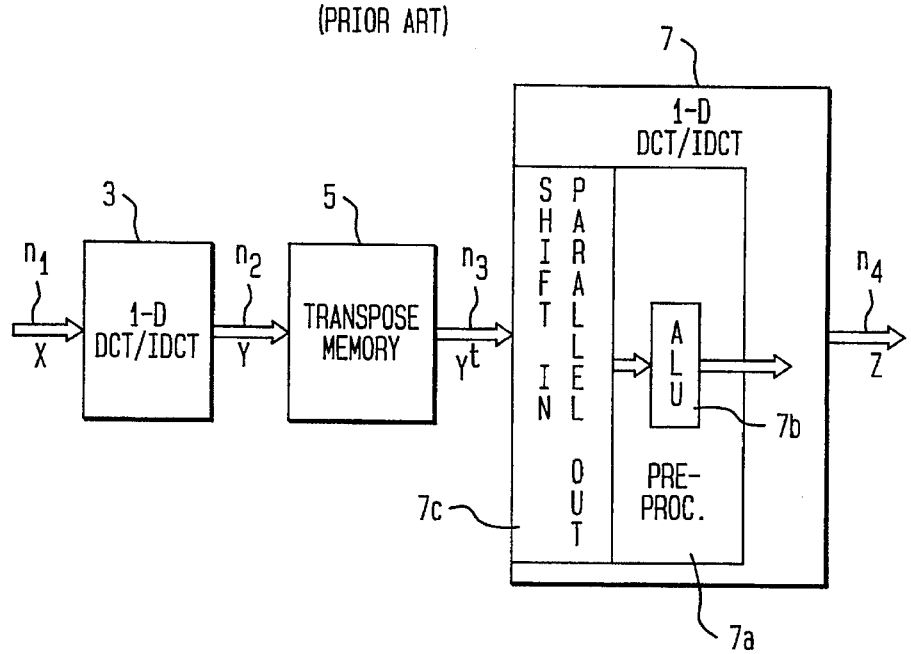
FIG. 1 shows a first conventional 2-D DCT/IDCT architecture.
Figure 2:
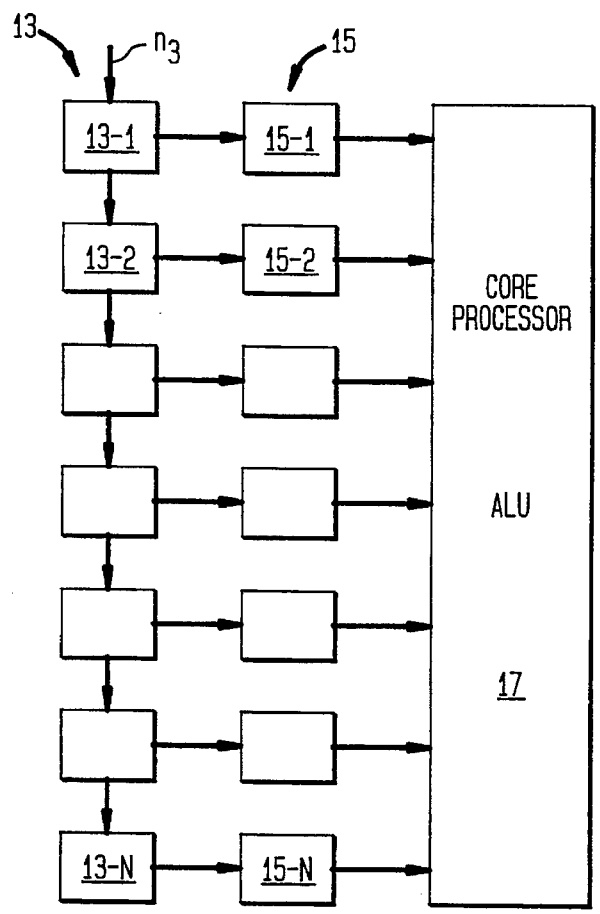
FIG. 2 shows a first conventional transpose memory architecture.
Figure 3:
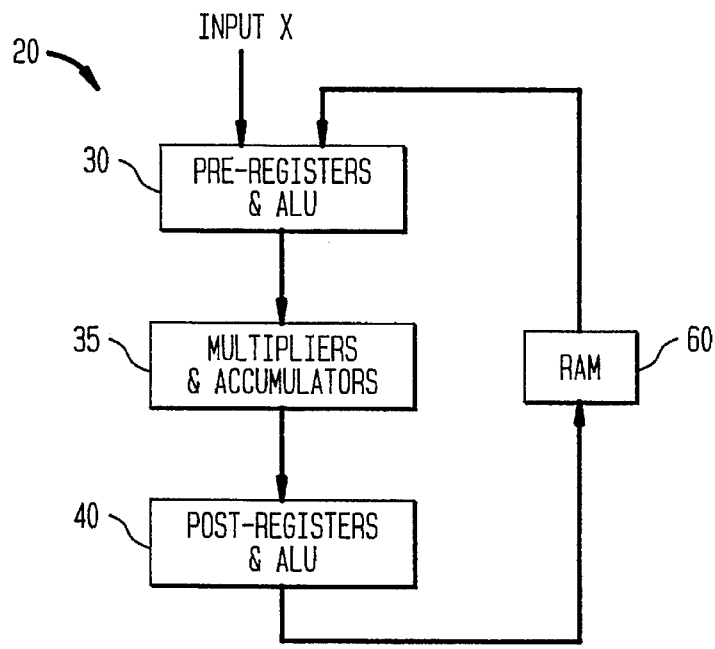
FIG. 3 shows a second conventional transpose memory architecture.
Figure 4:
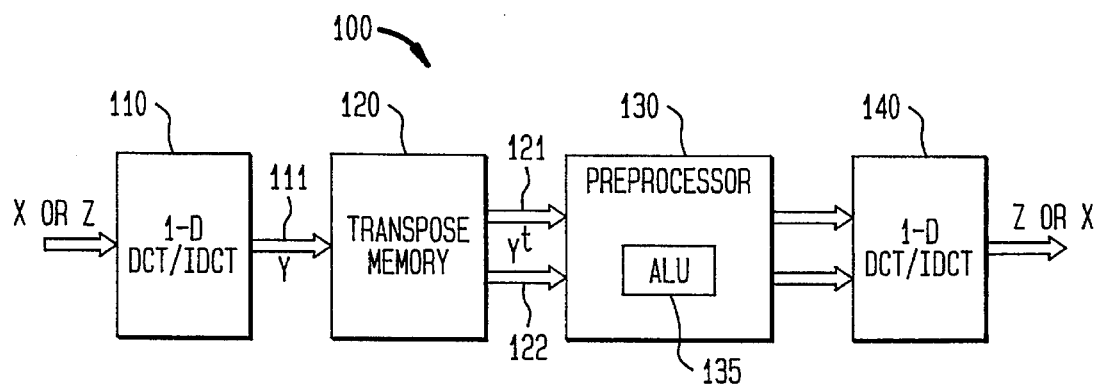
FIG. 4 shows a 2-D DCT/IDCT architecture according to the present invention.

FIG. 4 shows a 2-D DCT/IDCT architecture 100 according to the present invention. As shown, the 2-D DCT/IDCT architecture 100 has a 1-D DCT or IDCT circuit 110 as before which outputs intermediate matrices Y in row-column $y_0, y_1, y_2, \ldots, y_{63}$ (in the case of a DCT circuit 110) or shuffled row-column order $y_0, y_7, y_1, y_6, y_2, y_6, \ldots, y_{60}$ (in the case of an IDCT circuit 110). The outputted matrices Y are received by a transpose memory 120 according to the present invention via an n-bit line 111. The transpose memory 120 transposes and shuffles the inputted matrices. The transpose memory 120 outputs the matrices $y'$ in shuffled column row order to the DCT circuit 140 (or column row order in the case of an IDCT circuit 140), two elements at a time, via two n-bit lines 121 and 122. The matrices $Y'$ are received at a pre-processor 130 which is shown having only an ALU 135. Since the transpose memory 120 according to the present invention is capable of outputting the matrix $Y'$ in the correct order (i.e., shuffled column-row or non-shuffled column-row order, two elements at a time), the shift and parallel registers 13, 15 (FIG. 2) which are needed in prior art 2-D DCT/IDCT circuits may be omitted. The output of the pre-processor circuit 135 is then received by a 1-D DCT/IDCT circuit 140 which outputs the two-dimensionally transformed matrix, i.e., the transformed matrix Z or original data sequence X.

Figure 5:
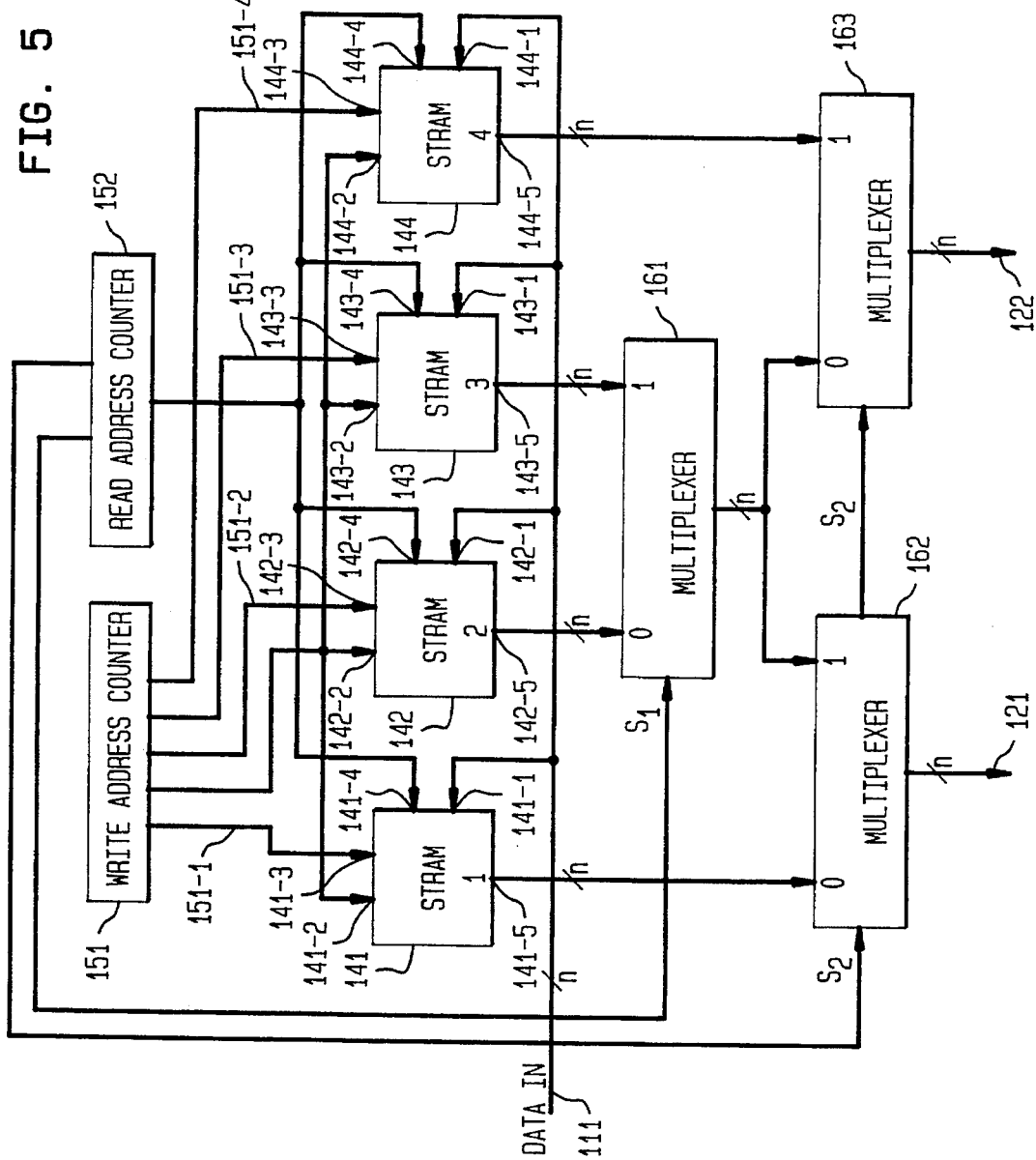
FIG. 5 shows a transpose memory according to the present invention in greater detail.
Figure 6D:
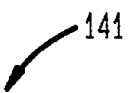
FIGS. 6(a), (b), (c), (d) show write counter orders according to one embodiment of the present invention.
Figure 6D:
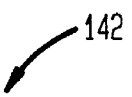
Figure 6D:
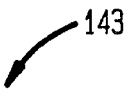
Figure 6D:
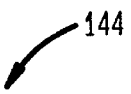

FIG. 5 shows the transpose memory 120 according to the present invention in greater detail. As shown, the transpose memory 120, which is capable of transposing an N×N matrix, has four sub-memories 141, 142, 143 and 144 which illustratively are smaller transpose dual port random access memories or "STRAMs". Each STRAM 141-144 has a two-dimensional memory array with a total of N/2×N/2 storage cells for storing one fourth of the elements of each inputted intermediate matrix Y. Each STRAM 141-144 has a corresponding data-in port 141-1, 142-1, 143-1 or 144-1 for receiving the elements of each intermediate matrix Y outputted from the 1-D DCT/IDCT circuit 110 (FIG. 4) via the n-bit line 111. Each STRAM 141-144 has a write address port 141-2, 142-2, 143-2 or 144-2, respectively connected to a write address counter 151. Furthermore, each STRAM has a chip enable terminal 141-3, 142-3, 143-3 or 144-3, respectively, connected to the write address counter 151 via a corresponding line 151-1, 151-2, 151-3 or 151-4. When the write address counter 151 generates a chip enable signal on the appropriate line 151-1, 151-2, 151-3 or 151-4, the corresponding STRAM 141, 142 143 or 144, respectively, is enabled. When enabled, the STRAM 141, 142, 143 or 144 writes the intermediate matrix element appearing on the data-in line 111 in the storage cell therein which storage cell is indicated by the address outputted by the write address counter 151.

In addition to the write address counter 151, the transpose memory 120 also has a read address counter 152. The read address counter 152 is connected to a read address port 141-4, 142-4, 143-4 and 144-4 of each STRAM 141-144, respectively. Furthermore, the read address counter 152 outputs two selector control signals S1 and S2, the purpose of which is discussed below. In response to receiving an address from the read address counter 152, each STRAM 141-144 reads-out, in parallel, the contents of the storage cell therein indicated by the read address counter 152. The STRAMs 141-144 output the read-out elements via the read ports 141-5, 142-5, 143-5 and 144-5.

A first multiplexer 161 is provided which receives the selector control signal S1 (outputted from the read address counter 152) as a selector control input. As shown, the first multiplexer 161 receives the elements outputted from the read port 142-5 of the second STRAM 142 at a first data input terminal and the elements outputted from the read port 143-5 of the third STRAM 143 at a second data input terminal.

A second multiplexer 162 and a third multiplexer 163 are provided which both receive the selector control signal $2 (outputted from the read address counter 152) as a selector control input. The output of the first multiplexer 161 is received as a first data input of the third multiplexer 163 and a second data input of the second multiplexer 162. The elements outputted from the read port 141-5 of the first STRAM 141 are received at a first data input terminal of the second multiplexer 162. The elements outputted from the read port 144-5 of the fourth STRAM 144 are received at a second data input terminal of the third multiplexer 163.

As mentioned above, each STRAM 141-144 outputs a matrix element in parallel from its read address port 141-5 to 144-5. By appropriate choice of select control signals S1 and S2, the read address counter 152 can cause the multiplexers 162 and 163 to simultaneously output the elements read-out of two different STRAMs 141, 142, 143 and 144.

The operation of the transpose memory 120 is now discussed. For purposes of convenience, it is assumed that each intermediate matrix Y is an 8×8 matrix with elements labeled in row-column order $y_0, y_1, \ldots, y_8, y_9, \ldots, y_{63}$. The write address counter 151 is capable of counting the storage cells of the STRAMs 141-144 according to one of a number of write counter orders. (Herein, the term "counter order" is used to refer to the order in which the read counter 152 or write counter 151 accesses the storage cells of the STRAMs 141-144. These "counter orders" should not be confused with "sequence orders" such as row-column, shuffled column-row, etc., which refer to the sequence order in which matrix elements are inputted to, or outputted from, the transpose memory 120.) For example, FIGS. 6(a), 6(b), 6(c) and 6(d) show four illustrative write counter orders of the write address counter 151. As shown in FIGS. 6(a)–(d), each STRAM 141-144 has a number of storage cells 171-0 to 171-5, 172-0 to 172-15, 173-0 to 173-15, and 174-0 to 174-15 including one storage cell for storing sixteen matrix elements (one fourth of an 8×8 intermediate matrix). The storage cells of each STRAM 141-144 are organized into a two-dimensional array. A label from 1 to 64 indicates the order in which the write counter 151 accesses the cells. For example, according to the write counter order of FIG. 6(a), on cycle 1, the write address counter 151 accesses the storage cell 171-0 of the STRAM 141. On cycle 2, the write address counter 151 accesses the storage cell 171-1 of the STRAM 141, etc.

Illustratively, the write counter order (FIGS. 6(a)–6(d)) in which the write address counter 151 counts is selected depending on the sequence order in which the elements of each inputted intermediate matrix Y are received and the sequence order in which they are to be outputted. These input and output sequence orderings are summarized in Table 1 below.

TABLE 1

| Cir. 110 | Input Sequence | Cir. 140 | Output Sequence |
|---|---|---|---|
| 1-D DCT | $y_0, y_1, \ldots, y_8,$ $y_9, \ldots, y_{63}$ | 1-D DCT | $(y_0, y_{56}), \ldots, (y_{24}, y_{32}), (y_0,$ $y_{56}), \ldots, (y_{24}, y_{32}), (y_{31}, y_{39})$ |
| 1-D IDCT | $y_0, y_1, \ldots, y_8,$ $y_{151}, \ldots, y_{60}$ | 1-D IDCT | $(y_0, y_8), \ldots, (y_{48}, y_{56}), (y_0,$ $y_8), \ldots, (y_{48}, y_{56}), (y_{55}, y_{63})$ |
| 1-D DCT | $y_0, y_1, \ldots, y_8,$ $y_9, \ldots y_{63}$ | 1-D IDCT | $(y_0, y_8), \ldots, (y_{48}, y_{56}), (y_0,$ $y_8), \ldots, (y_{48}, y_{56}), (y_{55}, y_{63})$ |
| 1-D IDCT | $y_0, y_7, \ldots, y_8,$ $y_{151}, \ldots, y_{60}$ | 1-D DCT | $(y_0, y_{56}), \ldots, (y_{24}, y_{32}), (y_0,$ $y_{56}), \ldots, (y_{24}, y_{32}), (y_{31}, y_{39})$ |

In Table 1, the outputted sequences are shown in parenthetical to indicate that a pair of elements is to be outputted each cycle. The write counter order may be predetermined or adjustable. For instance, the write counter order may be selected by inputting a control signal to the write address counter 151 via a control input (not shown) for selecting the appropriate write counter order.

An example is now discussed for the case of a 2-D DCT. As shown in Table 1, the 1-D DCT circuit 110 (FIG. 4) outputs each intermediate matrix Y as a row-column ordered sequence. The elements of the matrix Y in row-column order are inputted to the transpose memory 120 one element per cycle on data-in line 111. The transpose memory 120 outputs the elements of each inputted intermediate matrix Y to the pre-processor 135 in shuffled column-row order wherein each shuffled column is repeated (see Table 1). Suppose the 1-D DCT circuit 110 sequentially outputs the elements of a sequence of matrices Y1, Y2, Y3, Y4, .... The write address counter 151 illustratively counts according to the write counter order shown in FIG. 6(*a*). For example, the first received element $y^1_0$ is written in the storage cell 171-0 of the first STRAM 141, the second element $y^1_1$ is written in the storage cell 171-1, etc. The memory accesses and elements of the matrix Y1 written on each of the first 57 cycles are summarized below in Table 2.

TABLE 2

| # | In | # | In | # | In | # | In |
|---|---|---|---|---|---|---|---|
| 1 | $y_0^1$ 171-0 | 17 | $y_{16}^1$ 171-8 | 33 | $y_{32}^1$ 173-12 | 49 | $y_{48}^1$ 173-4 |
| 2 | $y_1^1$ 171-1 | 18 | $y_{17}^1$ 171-9 | 34 | $y_{33}^1$ 173-13 | 50 | $y_{49}^1$ 173-5 |
| 3 | $y_2^1$ 171-2 | 19 | $y_{18}^1$ 171-10 | 35 | $y_{34}^1$ 173-14 | 51 | $y_{50}^1$ 173-6 |
| 4 | $y_3^1$ 171-3 | 20 | $y_{19}^1$ 171-11 | 36 | $y_{35}^1$ 173-15 | 52 | $y_{51}^1$ 173-7 |
| 5 | $y_4^1$ 172-3 | 21 | $y_{20}^1$ 172-11 | 37 | $y_{36}^1$ 174-15 | 53 | $y_{52}^1$ 174-7 |
| 6 | $y_5^1$ 172-2 | 22 | $y_{21}^1$ 172-10 | 38 | $y_{37}^1$ 174-14 | 54 | $y_{53}^1$ 174-6 |
| 7 | $y_6^1$ 172-1 | 23 | $y_{22}^1$ 172-9 | 39 | $y_{38}^1$ 174-13 | 55 | $y_{54}^1$ 174-5 |
| 8 | $y_7^1$ 172-0 | 24 | $y_{23}^1$ 172-8 | 40 | $y_{39}^1$ 174-12 | 56 | $y_{55}^1$ 174-4 |
| 9 | $y_8^1$ 171-4 | 25 | $y_{24}^1$ 171-12 | 41 | $y_{40}^1$ 173-8 | 57 | $y_{56}^1$ 173-0 |
| 10 | $y_9^1$ 171-5 | 26 | $y_{25}^1$ 171-13 | 42 | $y_{41}^1$ 173-9 | | |
| 11 | $y_{10}^1$ 171-6 | 27 | $y_{26}^1$ 171-14 | 43 | $y_{42}^1$ 173-10 | | |
| 12 | $y_{11}^1$ 171-7 | 28 | $y_{27}^1$ 171-15 | 44 | $y_{43}^1$ 173-11 | | |
| 13 | $y_{12}^1$ 172-7 | 29 | $y_{28}^1$ 172-15 | 45 | $y_{44}^1$ 174-11 | | |
| 14 | $y_{13}^1$ 172-6 | 30 | $y_{29}^1$ 172-14 | 46 | $y_{45}^1$ 174-10 | | |
| 15 | $y_{14}^1$ 172-5 | 31 | $y_{30}^1$ 172-13 | 47 | $y_{46}^1$ 174-9 | | |
| 16 | $y_{15}^1$ 172-4 | 32 | $y_{31}^1$ 172-12 | 48 | $y_{47}^1$ 174-8 | | |

TABLE 2-continued

The state of the STRAMs 141–144 after cycle 57 is shown in FIG. 7. In FIG. 7, empty storage cells are indicated by shading.

It is possible in the present 2-D DCT example for the write address counter 151 to write received matrix elements in the STRAMs 141–144 while the read address counter 152 simultaneously reads-out pairs of previously stored matrix elements. The simultaneous reading-out and writing of matrix elements is now described.

Figure 8C:
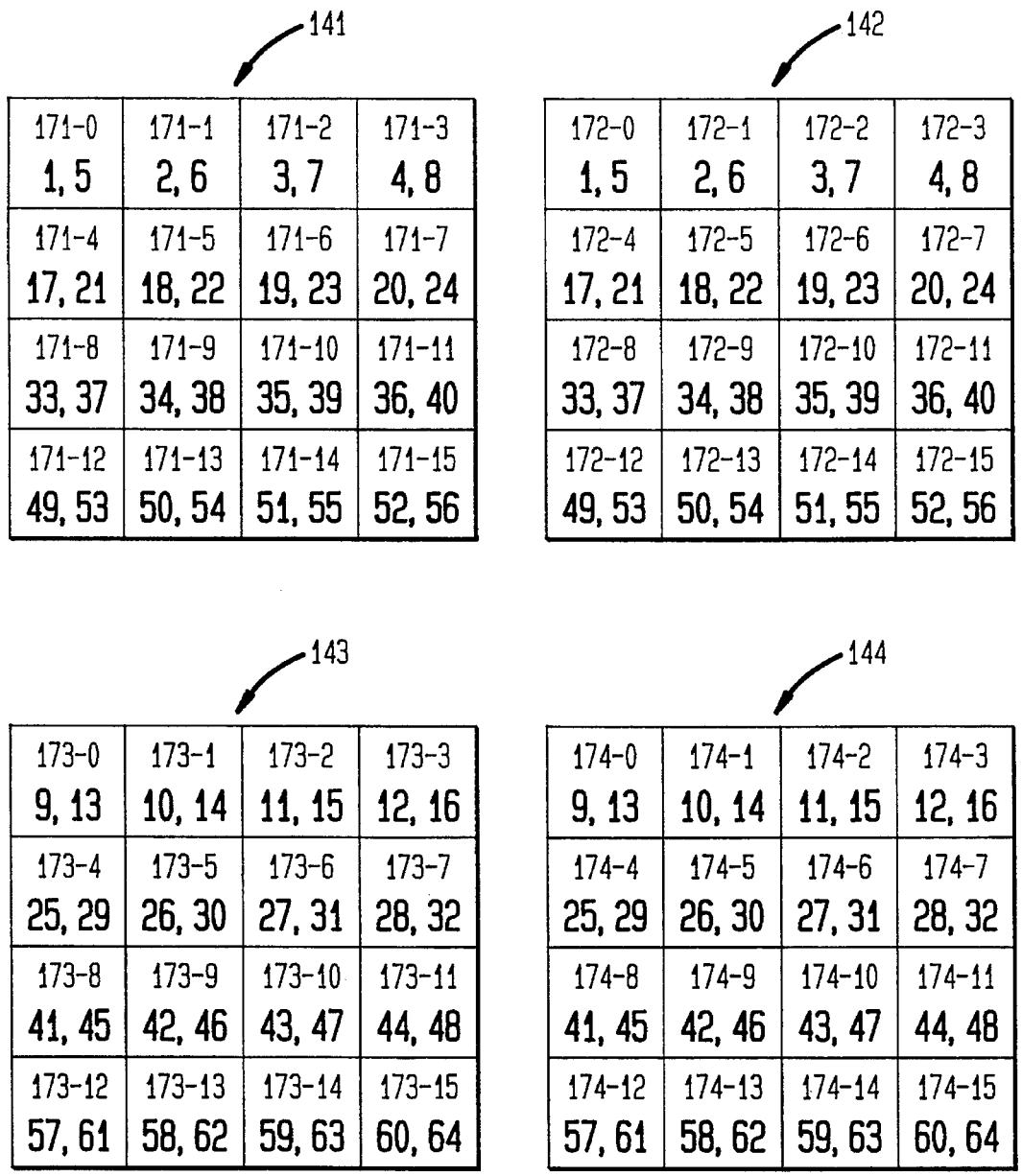
FIGS. 8(a), (b), (c), (d) show read counter orders according to one embodiment of the present invention.
Figure 8D:
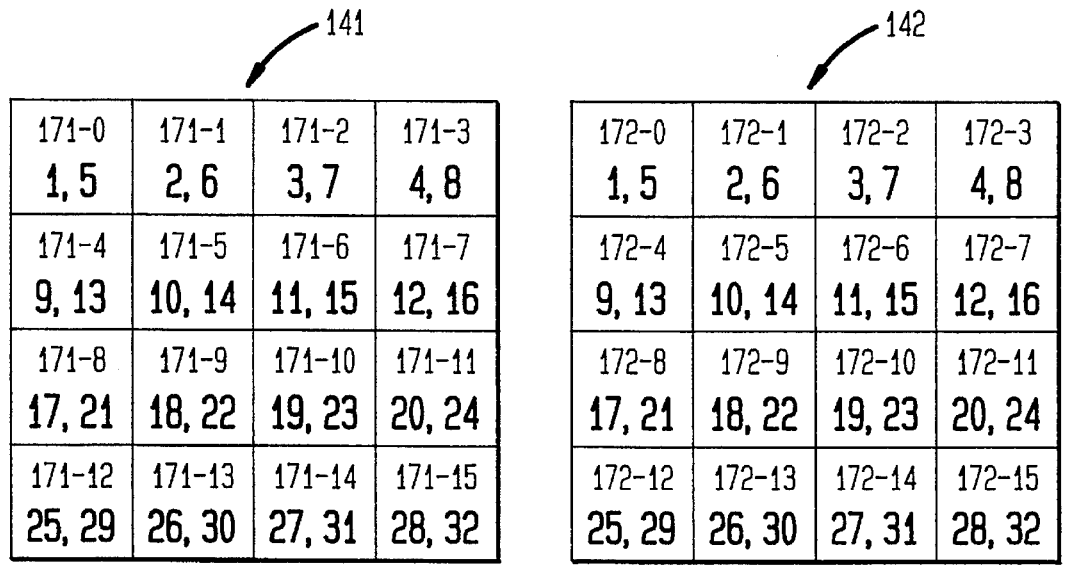
Figure 8D:
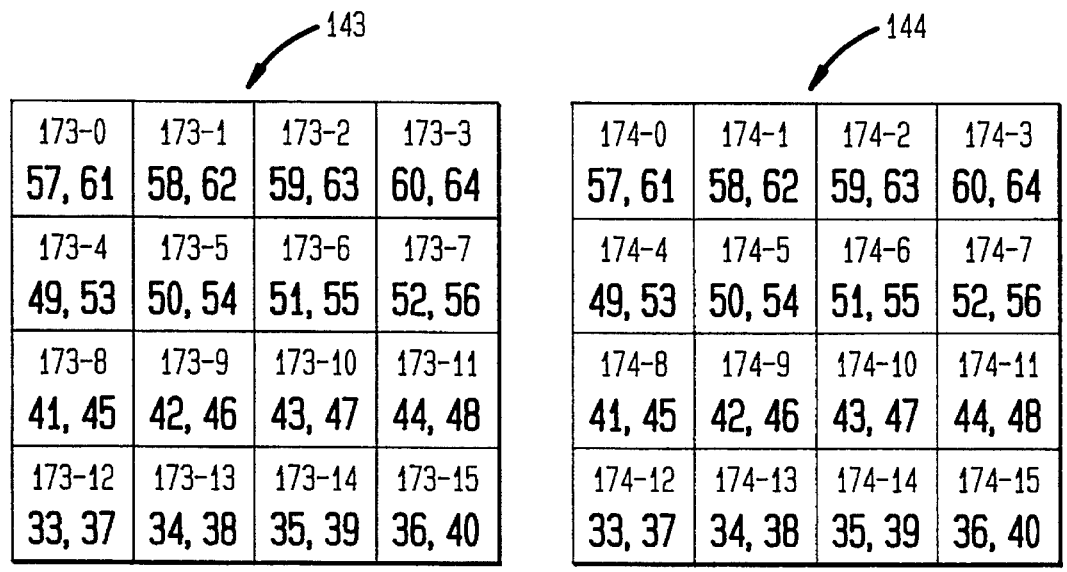

Like the write address counter 151, the read address counter 152 can count according to a number of read counter orders such as shown in FIGS. 8(*a*)–(*d*). The read counter orders may be predetermined and fixed or may be adjustable by transmitting a select signal to select inputs of the read counter 152 (not shown in FIG. 5). As shown in FIGS. 8(*a*)–8(*d*), the read address counter 152 accesses two storage cells simultaneously, one in each of two STRAMs 141–144. For example, in FIG. 8(*a*), on cycle 1, the read address counter 152 reads-out the elements in storage cells 171-0 and 173-0 of the STRAMs 141 and 143, respectively. Furthermore, the read address counter 152 repeats its access to the storage cells so as to repeat each outputted column of the received matrix. For example in FIG. 8(*a*), the read address counter 152 accesses one column 171-0, 173-0, 171-4, 173-4, 171-8, 173-8, 171-12, and 173-12 of the STRAMs 141 and 143 on cycles 1–4 and then access the same column of each STRAM 141 and 143 on cycles 5–8. This causes the read address counter 152 to read-out the sequence of pairs $(y^1_0, y^1_{56})$, $(y^1_8, y^1_{48})$, $(y^1_{16}, y^1_{40})$, $(y^1_{24}, y^1_{32})$ on cycles 1–4, respectively, and on cycles 5–8, respectively.

In order for the read and write address counters 151 and 152 to simultaneously read-out and write matrix elements, they must be synchronized in relation to each other. Assume that after cycle 57, the state of the STRAMs is as shown in FIG. 7. Starting on cycle 58, the read address counter 152 can begin to read-out pairs of matrix element according to the order shown in FIG. 8(*a*). Thus on cycle 58, the write address counter 151 stores the matrix element $y^1_{57}$ in the storage cell 173-1. In addition, the read address counter 152 reads-out the pair of matrix elements $(y^1_0, y^1_{56})$ from the storage cells 171-0 and 173-0. The read address counter 152 achieves this by outputting a single address to each STRAM 141–144 which reads-out the contents of the storage cells 171-0, 172-0, 173-0 and 174-0 in parallel. The read address counter 152 also outputs appropriate S1 and S2 select control signals for causing the multiplexer 161 to select the element outputted from the STRAM 143, for causing the multiplexer 162 to select the element outputted from the STRAM 141 and for causing the multiplexer 163 to select the element outputted from the multiplexer 161 (which element was outputted from the STRAM 143).

Likewise, on cycle 59, the write address counter 151 writes the element $y^1_{58}$ in the storage cell 173-2 while the read address counter 152 reads of the pair of elements ($y^1_8$, $y^1_{48}$) from the storage cells 171-4, 173-4. This process continues through cycle as shown in Table 3 below.

TABLE 3

| | | |
|---|---|---|
| 58 | $y^1_{57}$ 173-1 | ($y^1_0$, $y^1_{56}$) 171-0, 173-0 |
| 59 | $y^1_{58}$ 173-2 | ($y^1_8$, $y^1_{48}$) 171-4, 173-4 |
| 60 | $y^1_{59}$ 173-3 | ($y^1_{16}$, $y^1_{40}$) 171-8, 173-8 |
| 61 | $y^1_{60}$ 174-3 | ($y^1_{24}$, $y^1_{32}$) 171-12, 173-12 |
| 62 | $y^1_{61}$ 174-2 | ($y^1_0$, $y^1_{56}$) 171-0, 173-0 |
| 63 | $y^1_{62}$ 174-1 | ($y^1_8$, $y^1_{48}$) 171-4, 173-4 |
| 64 | $y^1_{63}$ 174-0 | ($y^1_{16}$, $y^1_{40}$) 171-8, 173-8 |
| 65 | $y^2_0$ 171-0 | ($y^1_{24}$, $y^1_{32}$) 171-12, 173-12 |
| 66 | $y^2_1$ 171-4 | ($y^1_1$, $y^1_{57}$) 171-1, 173-1 |
| 67 | $y^2_2$ 171-8 | ($y^1_9$, $y^1_{49}$) 171-5, 173-5 |
| 68 | $y^2_3$ 171-12 | ($y^1_{17}$, $y^1_{41}$) 171-9, 173-9 |
| 69 | $y^2_4$ 173-12 | ($y^1_{25}$, $y^1_{33}$) 171-13, 173-13 |
| 70 | $y^2_5$ 173-8 | ($y^1_1$, $y^1_{57}$) 171-1, 173-1 |
| 71 | $y^2_6$ 173-4 | ($y^1_9$, $y^1_{49}$) 171-5, 173-5 |
| 72 | $y^2_7$ 173-0 | ($y^1_{17}$, $y^1_{41}$) 171-9, 173-9 |
| 73 | $y^2_8$ 171-1 | ($y^1_{25}$, $y^1_{33}$) 171-13, 173-13 |
| 74 | $y^2_9$ 171-5 | ($y^1_2$, $y^1_{58}$) 171-2, 173-2 |
| 75 | $y^2_{10}$ 171-9 | ($y^1_{10}$, $y^1_{50}$) 171-6, 173-6 |
| 76 | $y^2_{11}$ 171-13 | ($y^1_{18}$, $y^1_{42}$) 171-10, 173-10 |
| 77 | $y^2_{12}$ 173-13 | ($y^1_{26}$, $y^1_{34}$) 171-14, 173-14 |
| 78 | $y^2_{13}$ 173-9 | ($y^1_2$, $y^1_{58}$) 171-2, 173-2 |
| 79 | $y^2_{14}$ 173-5 | ($y^1_{10}$, $y^1_{50}$) 171-6, 173-6 |
| 80 | $y^2_{15}$ 173-1 | ($y^1_{18}$, $y^1_{42}$) 171-10, 173-10 |
| 81 | $y^2_{16}$ 171-2 | ($y^1_{26}$, $y^1_{34}$) 171-14, 173-14 |
| . | . | . |
| . | . | . |
| . | . | . |
| 114 | $y^2_{49}$ 172-5 | ($y^1_7$, $y^1_{63}$) 172-0, 174-0 |
| 115 | $y^2_{50}$ 172-9 | ($y^1_{15}$, $y^1_{55}$) 172-4, 174-4 |
| 116 | $y^2_{51}$ 172-13 | ($y^1_{23}$, $y^1_{47}$) 172-8, 174-8 |
| 117 | $y^2_{52}$ 174-13 | ($y^1_{31}$, $y^1_{39}$) 172-12, 174-12 |
| 118 | $y^2_{53}$ 174-9 | ($y^1_7$, $y^1_{63}$) 172-0, 174-0 |
| 119 | $y^2_{54}$ 174-5 | ($y^1_{15}$, $y^1_{55}$) 172-4, 174-4 |
| 120 | $y^2_{55}$ 174-1 | ($y^1_{23}$, $y^1_{47}$) 172-8, 174-8 |
| 121 | $y^2_{56}$ 172-0 | ($y^1_{31}$, $y^1_{39}$) 172-12, 174-12 |

After cycle 64, the write address counter 151 has written in the last element $y^1_{63}$ of the first received matrix Y1. Furthermore, the read address counter 152 has nearly read out the entire first column of the matrix Y1 (in shuffled column row order) twice. The write address counter 151 may now write the elements of a second received matrix Y2 in the STRAMs 141–144 (which elements of the matrix Y2 are sequentially received in row-column order, i.e., $y^2_0$, $y^2_1$, ..., $y^2_8$, $y^2_9$, ..., $y^2_{63}$). However, the write address counter 151 may only write elements into storage cells no longer needed by the read address counter 152. That is, the write address counter 151 may only write received elements of the matrix Y2 into storage cells containing elements of the matrix Y1 already read-out by the read address counter 152 (or which will simultaneously be read-out by the read address counter 151). For instance, the write address counter 151 may write each element of the first row of the matrix Y2 into storage cells 171-0, 171-4, 171-8, 171-12, 173-0, 173-4, 173-8, and 173-12 which currently store the first column of the matrix Y1. In order to properly store the elements of the matrix Y2, in the cells no longer needed by the read address counter 152, the write address counter 151 counts according to the order shown in FIG. 6(d). Thus, on cycle 65, the write address counter 151 writes the element $y^2_0$ in the storage cell 171-0 while the read address counter 152 reads-out the elements ($y^1_{24}$, $y^1_{32}$) from the storage cells 171-12, 173-12. The writing of elements of the matrix Y2, and the read-out of elements of the matrix Y1, continues through cycle 121 as shown in Table 3. After cycle 121, the state of the STRAMs 141–144 is as shown in FIG. 9. In FIG. 9, shading is used to indicate storage cells which are "not needed" by the read address counter 152.

Starting on cycle 122, the read address counter 152 begins reading-out the elements of the matrix Y2. However, the matrix Y2 has been written in the storage cells of the STRAMs 141–144 according to a different counter order (FIG. 6(d)) than the matrix Y1 (FIG. 6(a)). Thus, the read address counter 152 must count according to a different order, i.e.., the read counter order shown on FIG. 8(d). Thus, on cycle 122, the write address counter writes the element $y^2_{57}$ in storage cell 172-4 while the read address counter 152 reads-out the elements ($y^2_0$, $y^2_{56}$) from the storage cells 171-0, 172-0. This simultaneous read-out according to the order of FIG. 8(d) and writing according to the order of FIG. 6(d) continues through cycle 128 as shown in Table 4 below.

TABLE 4

| | | |
|---|---|---|
| 122 | $y^2_{57}$ 172-4 | ($y^2_0$, $y^2_{56}$) 171-0, 172-0 |
| 123 | $y^2_{58}$ 172-8 | ($y^2_8$, $y^2_{48}$) 171-1, 172-1 |
| 124 | $y^2_{59}$ 172-12 | ($y^2_{16}$, $y^2_{40}$) 171-2, 172-2 |
| 125 | $y^2_{60}$ 174-12 | ($y^2_{24}$, $y^2_{32}$) 171-3, 172-3 |
| 126 | $y^2_{61}$ 174-8 | ($y^2_0$, $y^2_{56}$) 171-0, 172-0 |
| 127 | $y^2_{62}$ 174-4 | ($y^2_8$, $y^2_{48}$) 171-1, 172-1 |
| 128 | $y^2_{63}$ 174-0 | ($y^2_{16}$, $y^2_{40}$) 171-2, 172-2 |
| 129 | $y^3_0$ 171-0 | ($y^2_{24}$, $y^2_{32}$) 171-3, 172-3 |
| 130 | $y^3_1$ 171-1 | ($y^2_1$, $y^2_{57}$) 171-4, 172-4 |
| 131 | $y^3_2$ 171-2 | ($y^2_9$, $y^2_{49}$) 171-5, 172-5 |
| 132 | $y^3_3$ 171-3 | ($y^2_{17}$, $y^2_{41}$) 171-6, 172-6 |
| 133 | $y^3_4$ | ($y^2_{25}$, $y^2_{33}$) |

TABLE 4-continued

| | | 172-3 | 171-7, 172-7 |
|---|---|---|---|
| 134 | $y_5^3$ | | $(y_1^2, y_{57}^2)$ |
| | | 172-2 | 171-4, 172-4 |
| 135 | $y_6^3$ | | $(y_9^2, y_{49}^2)$ |
| | | 172-1 | 171-5, 172-5 |
| 136 | $y_7^3$ | | $(y_{17}^2, y_{41}^2)$ |
| | | 172-0 | 171-6, 172-6 |
| 137 | $y_8^3$ | | $(y_{25}^2, y_{33}^2)$ |
| | | 171-4 | 171-7, 172-7 |
| 138 | $y_9^3$ | | $(y_2^2, y_{58}^2)$ |
| | | 171-5 | 171-8, 172-8 |
| 139 | $y_{10}^3$ | | $(y_{10}^2, y_{50}^2)$ |
| | | 171-6 | 171-9, 172-9 |
| 140 | $y_{11}^3$ | | $(y_{18}^2, y_{42}^2)$ |
| | | 171-7 | 171-10, 172-10 |
| 141 | $y_{12}^3$ | | $(y_{26}^2, y_{34}^2)$ |
| | | 172-7 | 171-11, 172-11 |
| 142 | $y_{13}^3$ | | $(y_2^2, y_{58}^2)$ |
| | | 172-6 | 171-8, 172-8 |
| 143 | $y_{14}^3$ | | $(y_{10}^2, y_{50}^2)$ |
| | | 172-5 | 171-9, 172-9 |
| 144 | $y_{15}^3$ | | $(y_{18}^2, y_{42}^2)$ |
| | | 172-4 | 171-10, 172-10 |
| 145 | $y_{16}^3$ | | $(y_{26}^2, y_{34}^2)$ |
| | | 171-8 | 171-11, 172-11 |
| . | . | | . |
| . | . | | . |
| . | . | | . |
| 178 | $y_{49}^3$ | | $(y_7^2, y_{63}^2)$ |
| | | 173-5 | 173-0, 174-0 |
| 179 | $y_{50}^3$ | | $(y_{15}^2, y_{55}^2)$ |
| | | 173-6 | 173-1, 174-1 |
| 180 | $y_{51}^3$ | | $(y_{23}^2, y_{47}^2)$ |
| | | 173-7 | 173-2, 174-2 |
| 181 | $y_{52}^3$ | | $(y_{31}^2, y_{39}^2)$ |
| | | 174-7 | 173-3, 174-3 |
| 182 | $y_{53}^3$ | | $(y_7^2, y_{63}^2)$ |
| | | 174-6 | 173-0, 174-0 |
| 183 | $y_{54}^3$ | | $(y_{15}^2, y_{55}^2)$ |
| | | 174-5 | 173-1, 174-1 |
| 184 | $y_{55}^3$ | | $(y_{23}^2, y_{47}^2)$ |
| | | 174-4 | 173-2, 174-2 |
| 185 | $y_{56}^3$ | | $(y_{31}^2, y_{39}^2)$ |
| | | 173-0 | 173-3, 174-3 |

On cycle 129, the write address counter 151 begins writing elements of a subsequently received matrix Y3 in storage cells no longer needed by the read address counter 152. To that end, the write address counter 151 counts according to the write counter order shown in FIG. 6(a). Thus, on cycle 129, the write address counter 151 writes the element $y_0^3$ in the storage cell 171-0 while the read address counter 152 reads-out the elements $(y_{24}^2, y_{32}^2)$ from the storage cells 171-3 and 172-3. The simultaneous writing of elements of the matrix Y3 according to the write counter order of FIG. 6(a) and read-out of the matrix Y2 according to the read counter order of FIG. 8(d) continues through cycle 185 as shown in Table 4. After cycle 185, the state of the STRAMs is as shown in FIG. 10 (wherein storage cells which are "not needed" by the read address counter 152 are shown with shading).

As shown in FIG. 10, the storage of elements of the matrix Y3 is identical to the storage of elements Y1 (FIG. 7). Thus, it is possible to continue simultaneously writing received matrices and reading-out previously stored matrices indefinitely. In other words, the transpose memory 120 can continuously transpose intermediate matrices Y (without stoppages) if the write address counter 151 alternately counts according to the write counter orders FIGS. 6(a), 6(d) (i.e., according to FIG. 6(a) for each odd received matrix Y1, Y3, . . . and according to FIG. 6(d) for each even received matrix Y2, Y4, . . .) and the read address counter 152 alternately counts according to the read counter orders of FIGS. 8(a), 8(d). Furthermore, an examination of the write counter orders 6(a) and 6(d) reveals that they are the transpose of each other. Likewise, The read counter orders 8(a) and 8(d) are the transpose of each other.

The transpose memory 120 can also be used in a 2-D IDCT circuit. As shown in Table 1, the 1-D IDCT 110 circuit outputs a shuffled row-column sequence on the data-in line 111. The second 1-D IDCT circuit 140 requires two elements of the intermediate matrix Y at a time in column-row order wherein each column is repeated. This is achieved by the transpose memory 120 as follows. Suppose the 1-D IDCT circuit 110 (FIG. 4) sequentially outputs the elements of the matrices Y1, Y2, Y3, Y4, . . . .. A first shuffled row-column ordered intermediate matrix Y1 is outputted from the 1-D IDCT circuit 110 onto the data-in line 111. The write address counter 151 counts according to the second write counter order 6(b) and writes the received matrix elements as shown in Table 5 below.

TABLE 5

| # | In | # | In | # | In | # | In |
|---|---|---|---|---|---|---|---|
| 1 | $y_0^1$ | 17 | $y_{16}^1$ | 33 | $y_{32}^1$ | 49 | $y_{48}^1$ |
| | 171-0 | | 171-4 | | 171-8 | | 171-12 |
| 2 | $y_7^1$ | 18 | $y_{23}^1$ | 34 | $y_{39}^1$ | 50 | $y_{55}^1$ |
| | 172-3 | | 172-7 | | 172-11 | | 172-15 |
| 3 | $y_1^1$ | 19 | $y_{17}^1$ | 35 | $y_{33}^1$ | 51 | $y_{49}^1$ |
| | 172-0 | | 172-4 | | 172-8 | | 172-12 |
| 4 | $y_6^1$ | 20 | $y_{22}^1$ | 36 | $y_{38}^1$ | 52 | $y_{54}^1$ |
| | 171-3 | | 171-7 | | 171-11 | | 171-15 |
| 5 | $y_2^1$ | 21 | $y_{18}^1$ | 37 | $y_{34}^1$ | 53 | $y_{50}^1$ |
| | 171-1 | | 171-5 | | 171-9 | | 171-13 |
| 6 | $y_5^1$ | 22 | $y_{21}^1$ | 38 | $y_{37}^1$ | 54 | $y_{53}^1$ |
| | 172-2 | | 172-6 | | 172-10 | | 172-14 |
| 7 | $y_3^1$ | 23 | $y_{19}^1$ | 39 | $y_{35}^1$ | 55 | $y_{51}^1$ |
| | 172-1 | | 172-5 | | 172-9 | | 172-13 |
| 8 | $y_4^1$ | 24 | $y_{20}^1$ | 40 | $y_{36}^1$ | 56 | $y_{52}^1$ |
| | 171-2 | | 171-6 | | 171-10 | | 171-14 |
| 9 | $y_8^1$ | 25 | $y_{24}^1$ | 41 | $y_{40}^1$ | | |
| | 173-0 | | 173-4 | | 173-8 | | |
| 10 | $y_{15}^1$ | 26 | $y_{31}^1$ | 42 | $y_{47}^1$ | | |
| | 174-3 | | 174-7 | | 174-11 | | |
| 11 | $y_9^1$ | 27 | $y_{25}^1$ | 43 | $y_{41}^1$ | | |
| | 174-0 | | 174-4 | | 174-8 | | |
| 12 | $y_{14}^1$ | 28 | $y_{30}^1$ | 44 | $y_{46}^1$ | | |
| | 173-3 | | 173-7 | | 173-11 | | |
| 13 | $y_{10}^1$ | 29 | $y_{26}^1$ | 45 | $y_{42}^1$ | | |
| | 173-1 | | 173-5 | | 173-9 | | |
| 14 | $y_{13}^1$ | 30 | $y_{29}^1$ | 46 | $y_{45}^1$ | | |
| | 174-2 | | 174-6 | | 174-10 | | |
| 15 | $y_{11}^1$ | 31 | $y_{27}^1$ | 47 | $y_{43}^1$ | | |
| | 174-1 | | 174-5 | | 174-9 | | |
| 16 | $y_{12}^1$ | 32 | $y_{28}^1$ | 48 | $y_{44}^1$ | | |
| | 173-2 | | 173-6 | | 173-10 | | |

That is, on the first cycle, the element $y_0^1$ is written into the storage cell 171-0, on the second cycle, the element $y_7^1$ is written into the storage cell 172-3, on the third cycle, the element $y_1^1$ is written into the storage cell 172-0, on the fourth cycle, the element $y_6^1$ is written into the storage cell 171-3, etc. FIG. 11 shows the state of the storage cells of the STRAMs 141–144 after the cycle 56 (wherein shading indicates empty storage cells).

Table 6 below illustrates the simultaneous read-out and writing of matrix elements in the STRAMs 141–144 on cycles 57-120,

TABLE 6

| 57 | $y_{56}^1$ | $(y_0^1, y_8^1)$ |
|---|---|---|
| | 173-12 | 171-0, 173-0 |
| 58 | $y_{63}^1$ | $(y_{16}^1, y_{24}^1)$ |
| | 174-15 | 171-4, 173-4 |

TABLE 6-continued

| | | |
|---|---|---|
| 59 | $y_{57}^1$ 174-12 | $(y_{32}^1, y_{40}^1)$ 171-8, 173-8 |
| 60 | $y_{62}^1$ 173-15 | $(y_{48}^1, y_{56}^1)$ 171-12, 173-12 |
| 61 | $y_{58}^1$ 173-13 | $(y_0^1, y_8^1)$ 171-0, 173-0 |
| 62 | $y_{61}^1$ 174-14 | $(y_{16}^1, y_{24}^1)$ 171-4, 173-4 |
| 63 | $y_{59}^1$ 174-13 | $(y_{32}^1, y_{40}^1)$ 171-8, 173-8 |
| 64 | $y_{60}^1$ 173-14 | $(y_{48}^1, y_{56}^1)$ 171-12, 173-12 |
| 65 | $y_0^2$ 171-0 | $(y_1^1, y_9^1)$ 172-0, 174-0 |
| 66 | $y_7^2$ 173-12 | $(y_{17}^1, y_{25}^1)$ 172-4, 174-4 |
| 67 | $y_1^2$ 173-0 | $(y_{33}^1, y_{41}^1)$ 172-8, 174-8 |
| 68 | $y_6^2$ 171-2 | $(y_{49}^1, y_{57}^1)$ 172-12, 174-12 |
| 69 | $y_2^2$ 171-4 | $(y_1^1, y_9^1)$ 172-0, 174-0 |
| 70 | $y_5^2$ 173-8 | $(y_{17}^1, y_{25}^1)$ 172-4, 174-4 |
| 71 | $y_3^2$ 173-4 | $(y_{33}^1, y_{41}^1)$ 172-8, 174-8 |
| 72 | $y_4^2$ 171-8 | $(y_{49}^1, y_{57}^1)$ 172-12, 174-12 |
| 73 | $y_8^2$ 172-0 | $(y_2^1, y_{10}^1)$ 171-1, 173-1 |
| 74 | $y_{15}^2$ 174-12 | $(y_{18}^1, y_{26}^1)$ 171-5, 173-5 |
| 75 | $y_9^2$ 174-0 | $(y_{34}^1, y_{42}^1)$ 171-9, 173-9 |
| 76 | $y_{14}^2$ 172-12 | $(y_{50}^1, y_{58}^1)$ 171-13, 173-13 |
| 77 | $y_{10}^2$ 172-4 | $(y_2^1, y_{10}^1)$ 171-1, 173-1 |
| 78 | $y_{13}^2$ 174-8 | $(y_{18}^1, y_{26}^1)$ 171-5, 173-5 |
| 79 | $y_{11}^2$ 174-4 | $(y_{34}^1, y_{42}^1)$ 171-9, 173-9 |
| 80 | $y_{12}^2$ 172-8 | $(y_{50}^1, y_{58}^1)$ 171-13, 173-13 |
| . | . | . |
| . | . | . |
| . | . | . |
| 113 | $y_{40}^2$ 172-2 | $(y_7^1, y_{15}^1)$ 172-3, 174-3 |
| 114 | $y_{47}^2$ 174-14 | $y_{23}^1, y_{31}^1$ 172-7, 174-7 |
| 115 | $y_{41}^2$ 174-2 | $(y_{39}^1, y_{47}^1)$ 172-11, 174-11 |
| 116 | $y_{46}^2$ 172-14 | $(y_{55}^1, y_{63}^1)$ 172-15, 174-15 |
| 117 | $y_{42}^2$ 172-6 | $(y_7^1, y_{15}^1)$ 172-3, 174-3 |
| 118 | $y_{45}^2$ 174-10 | $(y_{23}^1, y_{31}^1)$ 172-7, 174-7 |
| 119 | $y_{43}^2$ 174-6 | $(y_{39}^1, y_{47}^1)$ 172-11, 174-11 |
| 120 | $y_{44}^2$ 172-10 | $(y_{55}^1, y_{63}^1)$ 172-15, 174-15 |

Starting on cycle 57, the read address counter 152 begins to read-out the matrix elements of the matrix Y1 according to the read counter order shown in FIG. 8(*b*). Thus, on cycle 57, the write address counter 151 writes the element $y_{56}^1$ in the storage cell 173-12 while the read address counter 152 reads out the elements ($y_0^1, y_8^1$) from the storage cells 171-0 and 173-0.

On cycle 65, the write address counter 151 begins writing the elements of the matrix Y2 in the storage cells of the STRAMs 141–144 no longer needed by the read address counter 152. To that end, the write address counter 151 counts according to the write counter order shown in FIG. 6(*c*). Thus on cycle 65, the write address counter 151 writes the element $y_0^2$ in the storage cell 171-0 while the read address counter 152 reads-out the elements ($y_1^1, y_9^1$), from the storage cells 172-0 and 174-0. The simultaneous writing of matrix elements according to the write counter order of FIG. 6(*c*) and read-out of elements according to the read counter order of FIG. 8(*b*) continues in this fashion through cycle 120. After cycle 120, the state of the STRAMs 141–144 is as shown in FIG. 12 (wherein shading indicates storage cells no longer needed by the read address counter 152).

Table 7 shows the simultaneous writing and read-out of elements in the STRAMs 141–144 on cycles 121–184.

TABLE 7

| | | |
|---|---|---|
| 121 | $(y_{56}^2$ 172-3 | $y_0^2, y_8^2)$ 171-0, 172-0 |
| 122 | $y_{63}^2$ 174-15 | $(y_{16}^2, y_{24}^2)$ 171-1, 172-1 |
| 123 | $y_{57}^2$ 174-3 | $(y_{32}^2, y_{40}^2)$ 171-2, 172-2 |
| 124 | $y_{62}^2$ 172-15 | $(y_{48}^2, y_{56}^2)$ 171-3, 172-3 |
| 125 | $y_{58}^2$ 172-7 | $(y_0^2, y_8^2)$ 171-0, 172-0 |
| 126 | $y_{61}^2$ 174-11 | $(y_{16}^2, y_{24}^2)$ 171-1, 172-1 |
| 127 | $y_{59}^2$ 174-7 | $(y_{32}^2, y_{40}^2)$ 171-2, 172-2 |
| 128 | $y_{60}^2$ 172-11 | $(y_{48}^2, y_{56}^2)$ 171-3, 172-3 |
| 129 | $y_0^3$ 171-0 | $(y_1^2, y_9^2)$ 173-0, 174-0 |
| 130 | $y_7^3$ 172-3 | $(y_{17}^2, y_{25}^2)$ 173-1, 174-1 |
| 131 | $y_1^3$ 171-1 | $(y_{33}^2, y_{41}^2)$ 173-2, 174-2 |
| 132 | $y_6^3$ 171-3 | $(y_{49}^2, y_{57}^2)$ 173-3, 174-3 |
| 133 | $y_2^3$ 171-1 | $(y_1^2, y_9^2)$ 173-0, 174-0 |
| 134 | $y_5^3$ 172-2 | $(y_{17}^2, y_{25}^2)$ 173-1, 174-1 |
| 135 | $y_3^3$ 172-1 | $(y_{33}^2, y_{41}^2)$ 173-2, 174-2 |
| 136 | $y_4^3$ 171-2 | $(y_{49}^2, y_{57}^2)$ 173-3, 174-3 |
| 137 | $y_8^3$ 173-0 | $(y_2^2, y_{10}^2)$ 171-4, 172-4 |
| 138 | $y_{15}^3$ 174-3 | $(y_{18}^2, y_{26}^2)$ 171-5, 172-5 |
| 139 | $y_9^3$ 174-0 | $(y_{34}^2, y_{42}^2)$ 171-6, 172-6 |
| 140 | $y_{14}^3$ 173-3 | $(y_{50}^2, y_{58}^2)$ 171-7, 172-7 |
| 141 | $y_{10}^3$ 173-1 | $(y_2^2, y_{10}^2)$ 171-4, 172-4 |
| 142 | $y_{13}^3$ 174-2 | $(y_{18}^2, y_{26}^2)$ 171-5, 172-5 |
| 143 | $y_{11}^3$ 174-1 | $(y_{34}^2, y_{42}^2)$ 171-6, 172-6 |
| 144 | $y_{12}^3$ 173-2 | $(y_{50}^2, y_{58}^2)$ 171-7, 172-7 |
| . | . | . |
| . | . | . |
| . | . | . |
| 177 | $y_{40}^3$ 173-8 | $(y_7^2, y_{57}^2)$ 173-12, 174-12 |
| 178 | $y_{47}^3$ 174-11 | $(y_{23}^2, y_{31}^2)$ 173-13, 174-13 |
| 179 | $y_{41}^3$ 174-8 | $(y_{39}^2, y_{47}^2)$ 173-14, 174-14 |
| 180 | $y_{46}^3$ 173-11 | $(y_{55}^2, y_{63}^2)$ 173-15, 174-15 |
| 181 | $y_{42}^3$ 173-9 | $(y_7^2, y_{15}^2)$ 173-12, 174-12 |
| 182 | $y_{45}^3$ 174-10 | $(y_{23}^2, y_{31}^2)$ 173-13, 174-13 |
| 183 | $y_{43}^3$ | $(_{39}^2, y_{47}^2)$ |

TABLE 7-continued

| | 174-9<br>$y_{44}^3$<br>173-10 | 173-14, 174-14<br>$(y_{55}^2, y_{63}^2)$<br>173-15, 174-15 |
|---|---|---|
| 184 | | |

The write address counter 151 counts according to the write counter order shown in FIG. 6(c) through cycle 128 for purposes of writing the elements of the matrix Y2. Then the write address counter counts according to the write counter order of FIG. 8(c) during cycles 121 through 184 for purposes of writing the elements of the matrix Y3. After cycle 184, the state of the STRAMs 141–144 is as shown in FIG. 13 (wherein shading indicates storage cells not needed by the read address counter 152). The state shown in FIG. 13 is similar to the state shown in FIG. 11. It is therefore possible to continue to simultaneously read-out and write matrices indefinitely according to the above-described process.

As with the 2-D DCT circuit 100, the transpose memory 120 can transpose intermediate matrices continuously (without stoppages) in the 2-D IDCT circuit 100. In such a case, the write address counter 151 alternately counts according to the write counter order of FIG. 6(b) and the write counter order of FIG. 6(c). Likewise, the read address counter 152 alternately counts according to the read counter order FIG. 8(b) and the read counter order of FIG. 8(c). Again, the write counter orders of FIGS. 6(b) and 6(c) are the transpose of each other. Likewise the read counter orders of FIGS. 8(b) and 8(c) are the transpose of each other.

As shown above, the write address counter 151 stores matrix elements in the STRAMs 141–144 in a fashion which facilitates the simultaneous read-out of a pair of matrix elements in the appropriate output sequence order. For instance, in the case that the matrix elements are to be outputted to a 1-D DCT circuit 140, the output sequence order is a shuffled column-row ordered sequence wherein each shuffled column is repeated, i.e., $(y_0, y_{56})$, ..., $(y_{24}, y_{32})$, $(y_0, y_{56})$, ..., $(y_{24}, y_{32})$, $(y_{31}, y_{39})$. Each pair of elements in the outputted sequence includes matrix elements from different quadrants. These matrix elements can be easily read-out simultaneously in pairs by the read address counter 152 because the write address counter 151 has stored the elements from different quadrants in different STRAMs 141–144. Likewise, matrix elements to be outputted to a 1-D IDCT circuit 140 are outputted in column-row order wherein each column is repeated, i.e., $(y_0, y_8)$, ..., $(y_{48}, y_{56})$, $(y_0, y_8)$, ..., $(y_{55}, y_{63})$. Each pair of elements comprises an element from an even row and an element from an odd row. Again, such pairs can be easily read-out simultaneously because the first counter 151 writes elements in odd rows in different STRAMs 141–144 than elements in even rows.

As further shown above, the write address counter 151 writes the received matrix elements in particular storage cells within each STRAM 141–144 for purposes of simplifying the read-out of matrix elements by the read address counter 152. An examination of the read counter orders of FIGS. 8(a)–(d) reveals that the read address counter 152 can simply output a single read address to each STRAM 141–144 and the appropriate selector control signals S1 and S2 in order to output a pair of elements. This is because the write address counter 151 writes the elements which form each outputted pair at corresponding addresses in their respective STRAMs 141–144. For example, as shown in Table 3 and FIG. 8(a), in order to read out the pair $(y_8, y^{48})$, the read address counter 152 can output a single address to each STRAM 141–144 (namely, the address for the storage cells 171-4, 172-4, 173-4 and 174-4) and appropriate selector control signals S1 and S2 (for selecting the matrix elements $y_8$ and $y_{16}$ outputted from the storage cells 171-4 and 173-4 of STRAMs 141 and 143).

The transpose memory 120 can also output each matrix of a received sequence of matrices according to different output sequence orders. For instance, a first inputted matrix can be outputted in shuffled column-row order while a second inputted matrix can be outputted in column-row order. However, in such a case, the first matrix must be read-out of the transpose memory 120 entirely before the second matrix is written in. Nevertheless, the delay incurred by the second matrix is only one block latency, wherein a block latency equals the time required to merely read-out a previous matrix from the STRAMs 141–144. This is an improvement over conventional transpose memories in which the second matrix would incur at least one system latency, wherein a system latency equals the time required to propagate one matrix through both 1-D transform circuits, the transpose memory, and the pre- and post-processing circuits.

In short, a transpose memory is disclosed which has four dual port memories, a first counter for writing elements in the dual port memories and a second counter for reading out elements from the dual port memories. If the received matrix is to be outputted to a first type of transform circuit (e.g., DCT), the first counter writes each matrix element in a particular dual port memory assigned to the quadrant of the matrix element. If the received matrix is to be outputted to a second type of transform circuit (e.g. IDCT), the first counter writes each matrix element in a particular dual port memory assigned to the "evenness" or "oddness" (i.e., divisibleness by two) of the row and column of the matrix element. Thus, the transpose memory occupies little area on an IC chip yet is capable of outputting elements according to one of a number of possible orders regardless of the input order.

Finally, the above description is intended to be merely illustrative. Numerous other embodiments may be devised by those having ordinary skill in the art without departing from the spirit and scope of the following claims.

We claim:

1. A transpose memory for receiving elements of a matrix according to a first sequence order and for outputting elements to a first or second type of transform circuit according to a second sequence order comprising:

four dual port memories, which memories each have a storage cell for storing an element of one fourth of said elements of said matrix, a first counter for writing each received matrix element, according to a first write counter order, in a particular storage cell of a first particular memory of said dual port memories which first particular memory corresponds to the matrix quadrant of said element, for said first type of transform circuit, and for writing each received matrix element, according to a second write counter order, in a particular storage cell of a second particular memory of said dual port memories which second particular memory corresponds to the matrix row and column evenness or oddness of said element, for said second type of transform circuit, and a second counter for simultaneously reading-out pairs of elements from particular storage cells of said memories according to said second sequence order.

2. The transpose memory of claim 1 wherein said first transform is a DCT and wherein said second transform is an IDCT.

3. The transpose memory of claim 1 wherein said second sequence order in which said matrix elements are outputted from said transpose memory is a transpose of said first sequence order in which said matrix elements are received at said transpose memory.

4. The transpose memory of claim 1 wherein said dual port memories are dual port RAMs.

5. The transpose memory of claim 1 wherein said transpose memory receives a sequence of matrices and wherein, for said first type of transform, said first counter writes said matrix elements of each odd received matrix in said storage cells according to said first write counter order and stores said matrix elements of each even received matrix in said storage cells according to a third write counter order which is a transpose of said first write counter order.

6. The transpose memory of claim 1 wherein said first and second counters are capable of counting simultaneously and wherein said counter orders of said first and second counters are synchronized with respect to each other and to the receipt of matrix elements at said transpose memory so that said second counter accesses said storage cells in a particular sequence so as to read-out elements of said received matrix only after said first counter accesses said particular storage cells for writing therein said matrix elements to be read-out by said second counter.

7. The transpose memory of claim 1 wherein said first counter outputs, in parallel, a count therein to write address input terminals of each of said four memories and wherein said first counter outputs appropriate enable signals to said memories for enabling the storage of a received matrix element in only one of said memories in a storage cell indicated by said count of said first counter.

8. The transpose memory of claim 1 wherein said first counter writes said received matrix elements in particular storage cells within each assigned dual port memory so that said second counter can read-out each of said matrix elements of each pair by outputting a single address to said-dual port memories.

9. The transpose memory of claim 1 wherein, according to said first ordering, said first counter writes matrix elements:

from front rows and front columns of said received matrix into a first one of said dual port memories, from front rows and recent columns of said received matrix into a second one of said dual port memories, from recent rows and front columns of said received matrix into a third one of said dual port memories, and from recent rows and recent columns of said received matrix into a fourth one of said dual port memories.

10. The transpose memory of claim 9 wherein, according to said second ordering, said first counter writes matrix elements:

from odd rows and odd columns of said received matrix into said first one of said memories, from odd rows and even columns of said received matrix into said second one of said memories, from even rows and odd columns of said received matrix into said third one of said memories, and from even rows and even columns of said received matrix into said fourth one of said memories.

11. The transpose memory of claim 1 wherein said second counter counts so as to read-out each pair two times.

12. The transpose memory of claim 11 wherein said second reading out of each pair is separated from said first reading out thereof by four counts of said second counter.

13. The transpose memory of claim 1 wherein said first counter writes said received matrix elements in said memories simultaneously while said second counter reads-out said pairs of elements from said memories.

14. A transpose memory for receiving elements of a matrix according to a first sequence order and for outputting elements to a first or second type of transform circuit according to a second sequence order comprising:

four dual port memories, which memories each have a storage cell for storing element of one fourth of said elements of said matrix, a first counter for writing each received matrix element in a particular storage cell of a particular memory corresponding to the matrix quadrant of said element, for said first type of transform circuit, and for writing each received matrix element in a particular storage cell of a memory corresponding to the matrix row and column evenness or oddness of said element, for said second type of transform circuit, a second counter for simultaneously reading-out pairs of elements from particular storage cells of said memories according to said second sequence order, a first multiplexer receiving matrix elements read-out from a first one of said memories and a second one of said memories at first and second data inputs thereof and a first selector control signal from said second counter at a selection control input thereof, a second multiplexer receiving matrix elements read-out from a third one of said memories and matrix elements selected by said first multiplexer at first and second data inputs thereof and a second selector control signal from said second counter at a selector control input thereof, and a third multiplexer receiving matrix elements selected by said first multiplexer and matrix elements read-out from a fourth one of said memories at first and second data inputs thereof and said second selector control signal at a selector control input thereof, wherein said second counter outputs, in parallel, a count thereof to each of said memories and outputs particular first and second selector control signals for selecting a matrix element in a storage cell indicated by said count of said second counter in each of two particular ones of said memories.

15. A two dimensional transform circuit comprising:

first and second one-dimensional transform circuits, said first one-dimensional transform circuit receiving an inputted matrix and outputting a first sequence of elements of a one-dimensionally transformed matrix according to a first sequence order, a transpose memory receiving said first sequence of matrix elements and comprising:

four dual port memories, which memories each have a storage cell for storing an element of one fourth of said first sequence of elements of said matrix, a first counter for writing each received matrix element of said first sequence, according to a first write counter order, in a particular storage cell of a first particular memory of said dual port memories which first particular memory corresponds to the matrix quadrant of said element, if said second one-dimensional transform circuit is a first type of transform circuit, and for writing each received matrix element of said first sequence, according to a second write counter order, in a particular storage cell of a second particular memory of said dual port memories which second particular memory corresponds to the matrix row and column evenness or oddness of said element, if said second one-dimensional transform circuit is a second type of transform circuit, and a second counter for simultaneously reading-out a second sequence of pairs of elements of said one dimensionally transformed matrix from particular storage cells of said memories according to a second sequence order, and wherein said second one-dimensional transform circuit receives said second sequence of elements and outputs a two-dimensionally transformed matrix.

* * * * *